United States Patent
Lee

(10) Patent No.: US 7,671,443 B2
(45) Date of Patent: Mar. 2, 2010

(54) INTEGRATED CIRCUIT FUSE STRUCTURES INCLUDING SPATTER SHIELDS WITHIN OPENING OF AN INSULATING LAYER AND SPACED APART FROM A SIDEWALL OF THE OPENING

(75) Inventor: Won-Chul Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 11/682,076

(22) Filed: Mar. 5, 2007

(65) Prior Publication Data

US 2007/0290295 A1 Dec. 20, 2007

(30) Foreign Application Priority Data

Jun. 16, 2006 (KR) .................... 10-2006-0054309

(51) Int. Cl.
*H01L 29/00* (2006.01)
*H01L 29/72* (2006.01)

(52) U.S. Cl. ...................... 257/529; 257/173

(58) Field of Classification Search ............. 257/173, 257/529, 665, E23.149, E21.592; 438/132, 438/215, 281, 333, 467, 601
See application file for complete search history.

(56) References Cited

U.S. PATENT DOCUMENTS 6,525,398 B1 * 2/2003 Kim et al. ............... 257/529
6,872,648 B2 3/2005 Friese et al.

FOREIGN PATENT DOCUMENTS

KR 10-2004-0059959 A 7/2004
KR 10-2005-0106876 A 11/2005

* cited by examiner

*Primary Examiner*—Hung Vu
(74) *Attorney, Agent, or Firm*—Myers Bigel Sibley & Sajovec, P.A.

(57) ABSTRACT

At least one fuse pattern extending in a first direction is formed on a fuse region of a substrate. A preliminary first insulating pattern is formed on the fuse region to cover the fuse pattern. A conductive layer is formed on the preliminary first insulating pattern. The conductive layer and the preliminary first insulating pattern are etched to form at least one fence extending in a second direction substantially perpendicular to the first direction. Related fuse structures are also disclosed.

19 Claims, 26 Drawing Sheets

INTEGRATED CIRCUIT FUSE STRUCTURES INCLUDING SPATTER SHIELDS WITHIN OPENING OF AN INSULATING LAYER AND SPACED APART FROM A SIDEWALL OF THE OPENING

FIELD OF THE INVENTION

The present invention relates to integrated circuit fuse structures and methods of forming the fuse structures. More particularly, the present invention relates to integrated circuit fuse structures used to cut off current and methods of forming the fuse structures.

BACKGROUND OF THE INVENTION

Integrated circuits are widely used in consumer, commercial and other applications. As is well known to those having skill in the art, many integrated circuits include fuse structures that may be used to selectively enable or disable portions of the integrated circuit and/or to personalize the integrated circuit. For example, in integrated circuit memory devices, fuse structures may be used to substitute redundant memory cells for defective memory cells. A conventional fuse structure includes an elongated fuse pattern having substantially a bar shape. Generally, an upper face of the fuse pattern is exposed. When a laser is irradiated onto the fuse pattern, the fuse pattern may boil. Thereafter, the fuse pattern may be exploded so that the fuse pattern may be cut. Thus, a current flowing through the conventional fuse pattern may be cut off.

FIG. 1 is a scanning electron microscope (SEM) picture showing a conventional fuse structure having a fuse pattern that is cut.

As shown in FIG. 1, a laser is irradiated onto a target region of the fuse pattern so that the fuse pattern may be cut. In this case, fractures of the target region may spatter widely so that the fracture may be attached to the remaining portion of the fuse pattern. In addition, the fracture may be attached to a wire pattern adjacent to the fuse pattern. As a result, the fracture may generate an electric short between the wire patterns.

SUMMARY OF THE INVENTION

In accordance with some embodiments of the present invention, an integrated circuit fuse structure includes an insulating structure, at least one fuse pattern and at least one fence. The insulating structure has a fuse region and a wire region adjacent to the fuse region. The fuse pattern extends on the fuse region and the wire region in a first direction. The fence extends on the fuse region in a second direction substantially perpendicular to the first direction. The fence prevents at least some fractures of the fuse pattern from spattering. The fractures may be generated when the fuse pattern is cut. In some embodiments, at least a portion of the fence extends away from the fuse region as a freestanding structure.

The fuse pattern may have a first width in a second direction. The fence may have a second width in the second direction. The second width may be substantially greater than the first width. Many apparent variations of a position of the fence are possible. As one example, the fence may enclose at least one fuse pattern in the second direction. That is, the fence may be overlapped with at least one fuse pattern. As another example, the fence may extend between the fuse patterns in the second direction. As still another example, two fences may face each other on the fuse pattern.

The fence may include a lower protecting pattern and an upper protecting pattern. The lower protecting pattern may include an insulating material. The upper protecting pattern is located on the lower protecting pattern. The upper protecting pattern includes a conductive material. The lower protecting pattern may insulate the upper protecting pattern from the fuse pattern. In other embodiments, the upper protecting pattern has a lower portion connected to the fuse pattern through the lower protecting pattern.

The fuse structure may include at least one first wire pattern, a first insulating pattern, at least one second wire pattern and a second insulating pattern. The first wire pattern may extend on the wire region in the first direction. The first insulating pattern may be located on the wire region such that the first insulating pattern covers the fuse pattern and the first wire pattern. The second wire pattern may be located on the first insulating pattern. The second insulating pattern may be located on the first insulating pattern to cover the second wire pattern.

Integrated circuit fuse structures according to other embodiments of the invention include an integrated circuit substrate, an elongated fuse pattern extending along a face of the integrated circuit substrate in a given-direction, and a spatter shield wall. The spatter shield wall includes a pair of opposing faces that extend away from the face of the integrated circuit substrate and that also extend transverse to the given direction. The pair of opposing faces define a pair of opposing ends that also extend away from the face of the integrated circuit substrate. The spatter shield wall faces between the pair of opposing ends are wider than the elongated fuse pattern. The spatter shield wall is located on the integrated circuit substrate relative to the elongated fuse pattern, so as to block at least some spatter that is produced along the given direction when the fuse pattern is cut. In some embodiments, the spatter shield wall is located so as to cross over a first end of the elongated fuse pattern. A second spatter shield wall may be provided to cross over the second end of the elongated fuse pattern. In some embodiments, at least a portion of the spatter shield extends away from the face of the integrated circuit substrate as a freestanding structure.

Integrated circuit fuse structures according to other embodiments of the present invention include an integrated circuit substrate, an elongated fuse pattern extending along a face of the integrated circuit substrate in a given direction and a spatter shield that extends away from the face of the integrated circuit substrate. The spatter shield includes a first portion adjacent the integrated circuit and comprising insulating material, and a second portion on the first portion, remote from the integrated circuit substrate and comprising conductive material. The spatter shield is located on the integrated circuit substrate relative to the elongated fuse pattern, so as to block at least some spatter that is produced along the given direction when the fuse pattern is cut. In some embodiments, the second portion may be electrically connected to the fuse pattern. In some embodiments, at least a portion of the spatter shield extends away from the face of the integrated circuit substrate as a freestanding structure.

In accordance with other embodiments of the present invention, methods of forming fuse structures are provided. In these methods, at least one fuse pattern extending in a first direction on a fuse region is formed. A preliminary first insulating pattern is formed on the fuse region to cover the fuse pattern. A conductive layer is formed on the preliminary first insulating pattern. The conductive layer and the preliminary first insulating-pattern are etched to form at least one fence extending in a second direction substantially perpendicular to the first direction.

The methods of forming the fuse structure may further comprise forming a second insulating layer on the preliminary first insulating pattern to cover the upper protecting pattern. In these embodiments, the second insulating layer may be removed by the second etching process. The fuse pattern has a first width in the second direction and the fence has a second width in the second direction. The second width may be substantially greater than the first width.

Many variations of a position of the fence are possible. As one example, the fence may enclose at least one fuse pattern in the second direction. That is, the fence may be overlapped with at least one fuse pattern. As another example, the fence may extend between the fuse patterns in the second direction. As still another example, two fences may face each other on the fuse pattern.

In order to form the fence, a first etching process may be performed on the conductive layer to form at least one upper protecting pattern. Thereafter, a second etching process may be performed on the preliminary first insulating pattern to form a lower protecting pattern located under the upper protecting pattern.

The lower protecting pattern may insulate the upper protecting pattern from the fuse pattern. Alternatively, the upper protecting pattern may have a lower portion connected to the fuse pattern through the lower protecting pattern.

In accordance with other embodiments of the present invention, other methods of forming fuse structures are provided. In these methods, at least one fuse pattern and at least one first wire pattern are formed on an insulating structure having a fuse region and a wire region. The fuse pattern extends in a first direction on the fuse region and the wire region. The first wire pattern extends in the first direction on the wire region. The fuse pattern has a first width in a second direction substantially perpendicular to the first direction. A preliminary first insulating pattern is formed on the insulating structure to cover the fuse pattern and the first wire pattern. A conductive layer is formed on the preliminary first insulating pattern. The conductive layer is etched to form at least one upper protecting pattern and at least one second wire pattern. The upper protecting pattern that is located over the fuse region and extends in the second direction has a second width in the second direction substantially larger than the first width. The second wire pattern is located over the wire region. A second insulating layer is formed on the preliminary first insulating pattern to cover the upper protecting pattern and the second wire pattern. An etching process is performed on the second insulating layer and the preliminary first insulating pattern. The second insulating layer is transformed into the second insulating pattern vertically corresponding to the wire region by the etching process. The preliminary first insulating pattern is transformed into a first insulating pattern and a lower protecting pattern by the etching process. The first insulating pattern vertically corresponds to the wire region. The lower protecting pattern is located under the upper protecting pattern.

According to some embodiments of the present invention, a fence including a lower protecting pattern and an upper protecting pattern is provided. The fence may prevent at least some fractures of a fuse pattern from spattering when the fuse pattern is cut by a laser. Thus, likelihood of an electric short generated between wire patterns adjacent to the fuse pattern may be reduced or prevented.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION

Figure 1:
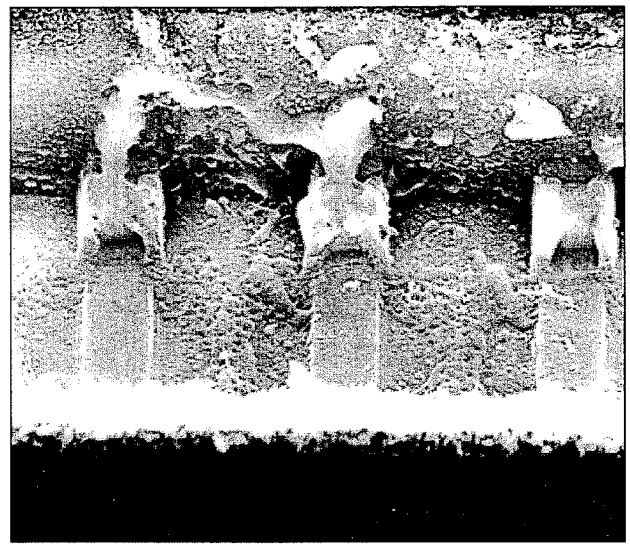
FIG. 1 is a scanning electron microscope (SEM) picture showing a conventional fuse structure having a fuse pattern that is cut.

This U.S. non-provisional patent application claims priority under 35 U.S.C. §119 to Korean Patent Application No. 10-2006-0054309, filed Jun. 16, 2006, the entire contents of which are hereby incorporated herein by reference.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on,"

"directly connected to" and/or "directly coupled to" another element or layer, no intervening elements or layers are present. As used herein, the term "and/or" may include any and all combinations of one or more of the associated listed items and may be abbreviated as "/".

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include a fourth member, whereas the expression "at least one selected from the group consisting of A, B, and C" does not.

As used herein, the expression "or" is not an "exclusive or" unless it is used in conjunction with the phrase "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to plan views and cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Figure 2:
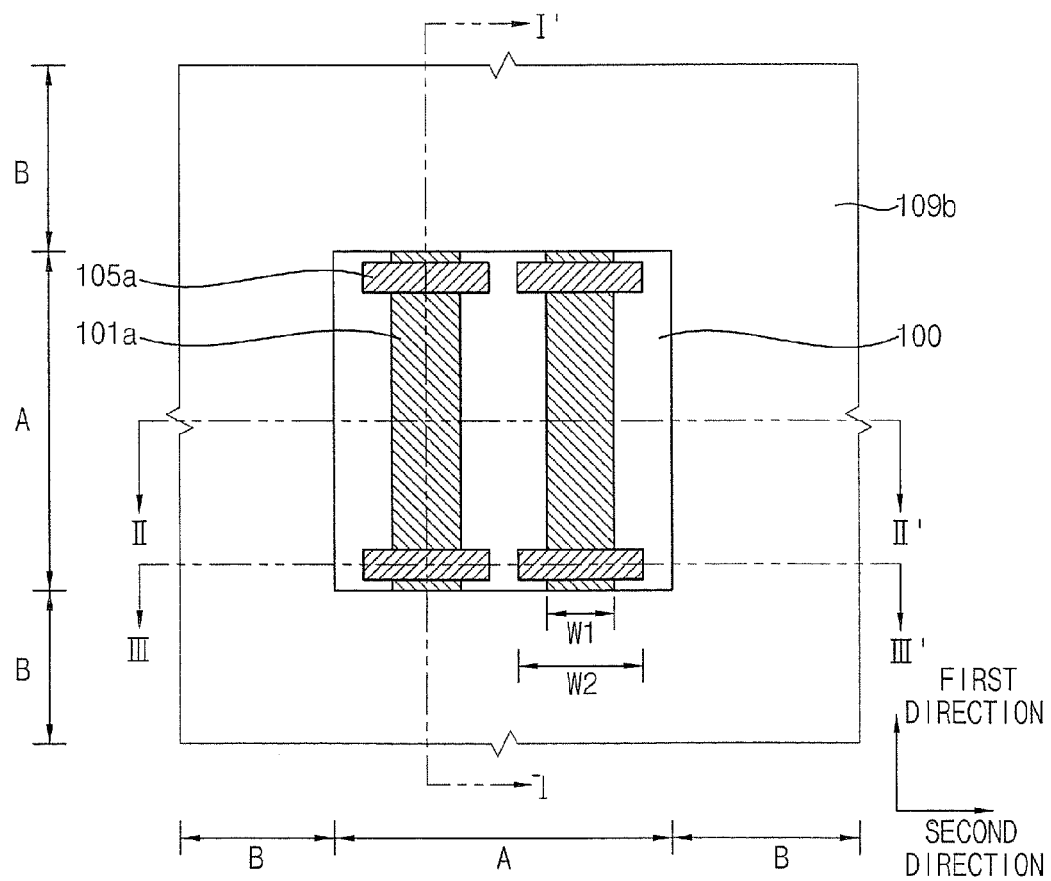
FIG. 2 is a plan view illustrating a fuse structure in accordance with some embodiments of the present invention.
Figure 3:
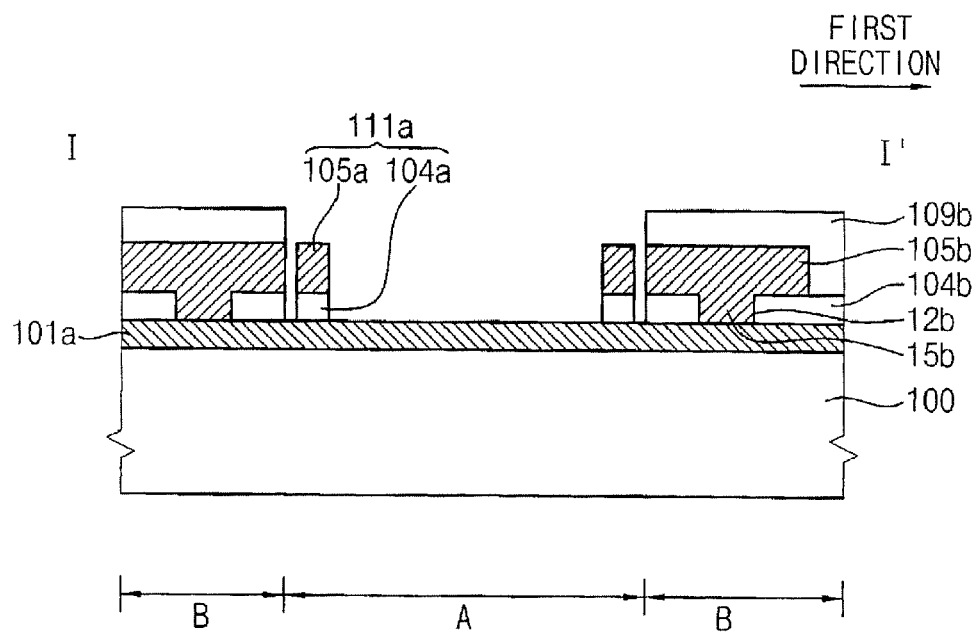
FIG. 3 is a cross-sectional view taken along I-I' line in FIG. 2.
Figure 4:
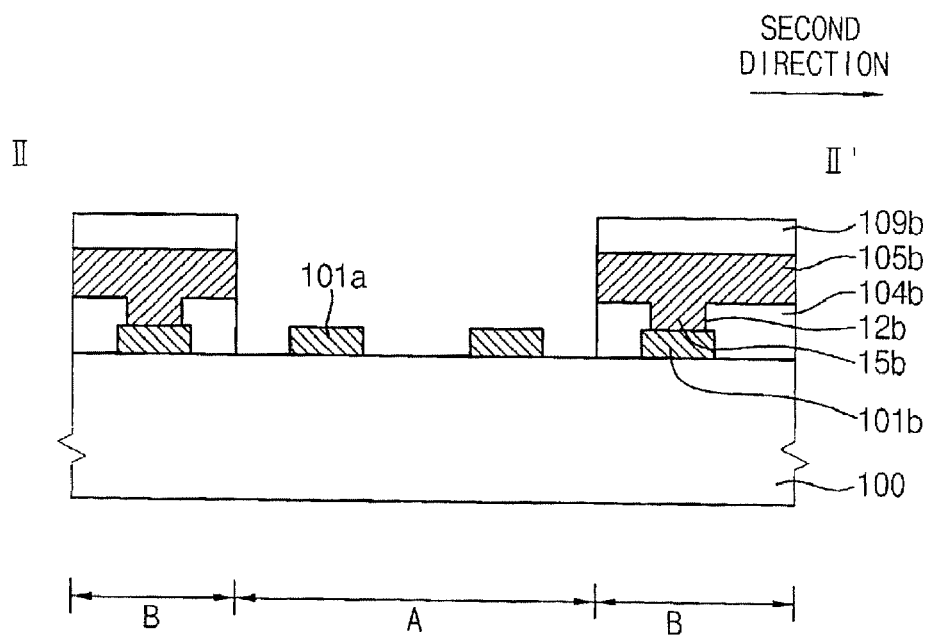
FIG. 4 is a cross-sectional view taken along II-II' line in FIG. 2.
Figure 5:
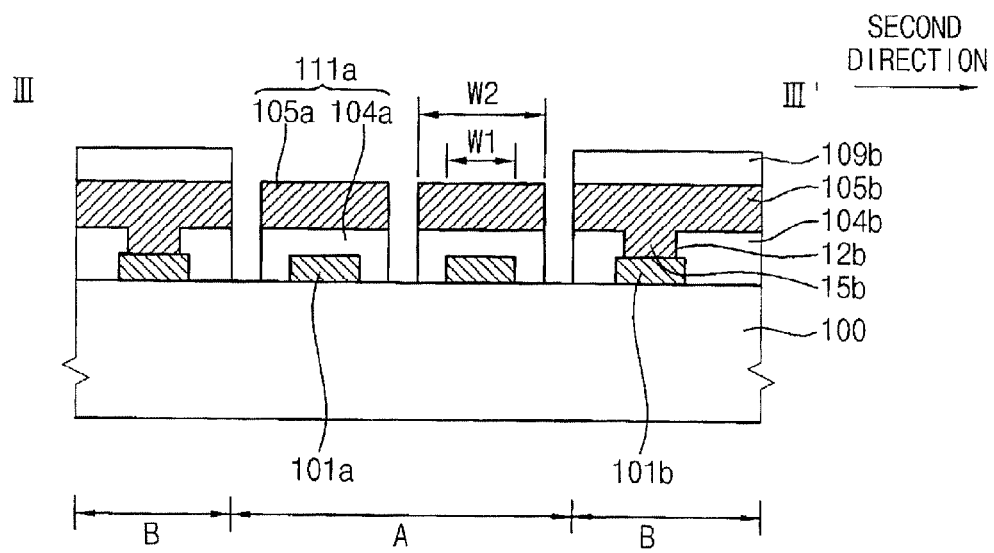
FIG. 5 is a cross-sectional view taken along III-III' line in FIG. 2.

FIG. 2 is a plan view illustrating a fuse structure in accordance with some embodiments of the present invention. FIG. 3 is a cross-sectional view taken along I-I' line in FIG. 2. FIG. 4 is a cross-sectional view taken along II-II' line in FIG. 2. FIG. 5 is a cross-sectional view taken along III-III' line in FIG. 2.

Referring to FIGS. 2 to 5, an insulating structure 100 having a fuse region A and a wire region B is provided on an integrated circuit substrate, such as a semiconductor substrate. The insulating structure 100 may include an oxide such as silicon oxide. Alternatively, the insulating structure 100 may include a nitride such as silicon nitride.

Although not illustrated in FIGS. 2 to 5, a contact electrically connected to a conductive structure that is located in the substrate below the insulating structure 100 may be provided through the insulating structure. For example, the conductive structure may be a transistor, a capacitor, a wire pattern, a word line, a bit line, a source region or a drain region.

At least one fuse pattern 101a and at least one first wire pattern 101b are provided on the insulating structure 100. The fuse pattern 101a and the first wire pattern 101b may include a metal such as aluminum. Alternatively, the fuse pattern 101a and the first wire pattern 101b may include polysilicon doped with impurities.

The fuse pattern 101a may extend in a first direction on the fuse region A and the wire region B. In addition, the fuse pattern 101a may have a first width W1 in a second direction substantially perpendicular to the first direction. The first wire pattern 101b may extend in the first direction on the wire region B.

The fuse pattern 101a may be spaced apart from the first wire pattern 101b in the second direction. When the number of fuse patterns 101a is at least two, the fuse patterns 101a may be spaced apart from one another in the second direction. In addition, when the number of first wire patterns 101b is at least two, the fuse patterns 101a may be spaced apart from one another in the second direction.

A first insulating pattern 104b is provided on the wire region B of the insulating structure 100. The first insulating pattern 104b may cover the fuse pattern 101a and the wire pattern 101b. The first insulating pattern 104b may include an oxide such as silicon oxide. Alternatively, the first insulating pattern 104b may include a nitride such as silicon nitride. The first insulating pattern 104b may have at least one second hole 12b exposing the fuse pattern 101a or the first wire pattern 101b.

At least one lower protecting pattern 104a is provided on the fuse region A. A height of the lower protecting pattern 104a may be substantially the same as a height of the first insulating pattern 104b. The lower protecting pattern 104a may include an oxide such as silicon oxide. Alternatively, the lower protecting pattern 104a may include a nitride such as silicon nitride.

The lower protecting pattern 104a may extend in the second direction. The lower protecting pattern 104a may have a second width W2 in the second direction. The second width W2 may be substantially larger than the first width W1. The lower protecting pattern 104a may be spaced apart from the first insulating pattern 104b. In case that the number of lower protecting patterns 104a is at least two, the lower protecting patterns 104a may be spaced apart from one another.

As illustrated in FIGS. 2 and 5, the lower protecting pattern 104a may cover the fuse pattern 101a in the second direction. That is, the lower protecting pattern 104a may be overlapped with the fuse pattern 101a. However, a position of the lower protecting pattern 104a may be varied. In one example, the lower protecting pattern 104a may extend in the second direction between the fuse patterns 101a. In another example, the lower protecting pattern 104a may cover at least two fuse patterns 101a in the second direction. That is, the lower protecting pattern 104a may be overlapped with at least two fuse patterns 101a.

At least one second wire pattern 105b is located on the first insulating pattern 104b. The second wire pattern 105b may have a lower portion 15b filling up the second hole 12b. Thus, the second wire pattern 105b may be electrically connected to the fuse pattern 101a or the first wire pattern 101b.

The second wire pattern 105b may include a metal such as aluminum. Alternatively, the second wire pattern 105b may include polysilicon doped with impurities. In case that the number of second wire patterns 105b is at least two, the second wire patterns 105b are spaced apart from one another.

An upper protecting pattern 105a is provided on the lower protecting pattern 104a. Thus, a fence 111a including the lower protecting pattern 104a and the upper protecting pattern 105a may be provided. The fence 111a may prevent at least some fractures of the fuse pattern 101a from spattering in a direction in which the fuse pattern 101a extends. The fractures of the fuse pattern 101a may be generated when the fuse pattern 101a is cut by a laser.

A height of the upper protecting pattern 105a may be substantially the same as a height of the second wire pattern 105b. The upper protecting pattern 105a may include a metal such as aluminum. Alternatively, the upper protecting pattern 105a may include polysilicon doped with impurities. The lower protecting pattern 104a located between the upper protecting pattern 105a and the fuse pattern 101a may electrically insulate the upper protecting pattern 105 from the fuse pattern 101a.

A second insulating pattern 109b may be located on the first insulating pattern 104b. The second insulating pattern 109b covers the second wire pattern 105b. The second insulating pattern 109b may include an oxide such as silicon oxide. Alternatively, the second insulating pattern 109b includes a nitride such as silicon nitride. As illustrated in FIGS. 2 and 3, two fences 111a may be formed on the fuse pattern 101a such that two fences 111a face each other. In this case, the laser used to cut the fuse pattern 101a may be irradiated onto a portion of the fuse pattern 101a exposed between the fences 111a.

It will be understood by those having skill in the art that, in other embodiments, the fence 111a may extend transverse to the first direction and need not be substantially perpendicular thereto. Moreover, the fence 111a may be regarded as defining a spatter shield wall having a pair of opposing faces that extend away from the face of the integrated circuit substrate, and that also extend transverse to the first direction. The pair of opposing faces defines a pair of opposing ends that also extend away from the face of the integrated circuit substrate. The spatter shield wall faces between the pair of opposing ends are wider than the elongated fuse pattern. The spatter shield wall is located on the integrated circuit substrate relative to the elongated fuse pattern 101a, so as to block at least some spatter that is produced along the given first direction when the fuse pattern 101a is cut. Moreover, as illustrated, at least a portion of the spatter shield wall may extend away from the face of the integrated circuit substrate as a freestanding structure.

FIGS. 6, 9, 12, 16, 20 and 24 are plan views illustrating methods of forming fuse structures in FIGS. 2 to 5. FIGS. 7, 10, 13, 17, 21 and 25 are cross-sectional views taken along I-I' line in FIGS. 6, 9, 12, 16, 20 and 24, respectively. FIGS. 8, 11, 14, 18, 22 and 26 are cross-sectional views taken along II-II' line in FIGS. 6, 9, 12, 16, 20 and 24, respectively. FIGS. 15, 19, 23 and 27 are cross-sectional views taken along III-III' line in FIGS. 12, 16, 20 and 24, respectively.

Figure 6:
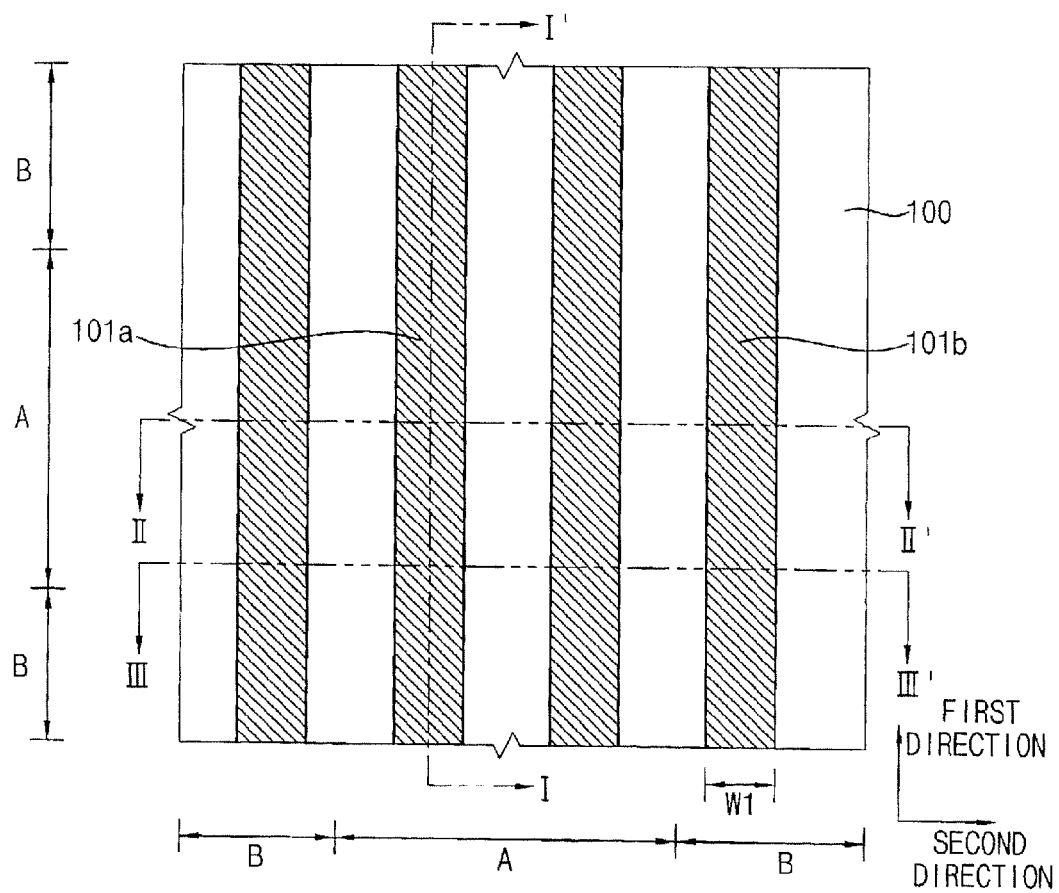
FIGS. 6, 9, 12, 16, 20 and 24 are plan views illustrating methods of forming fuse structures in FIGS. 2 to 5.
Figure 7:
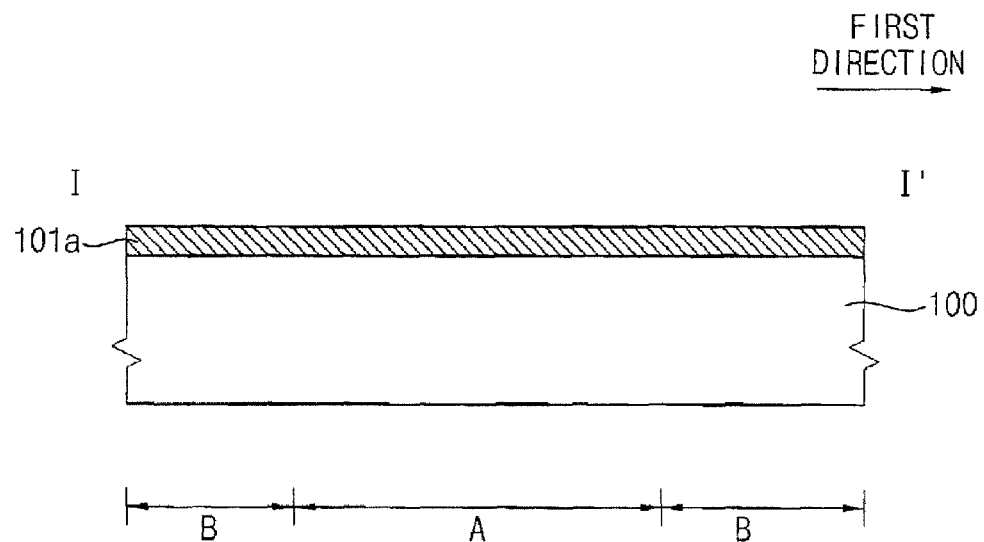
FIGS. 7, 10, 13, 17, 21 and 25 are cross-sectional views taken along I-I' line in FIGS. 6, 9, 12, 16, 20 and 24, respectively.
Figure 8:
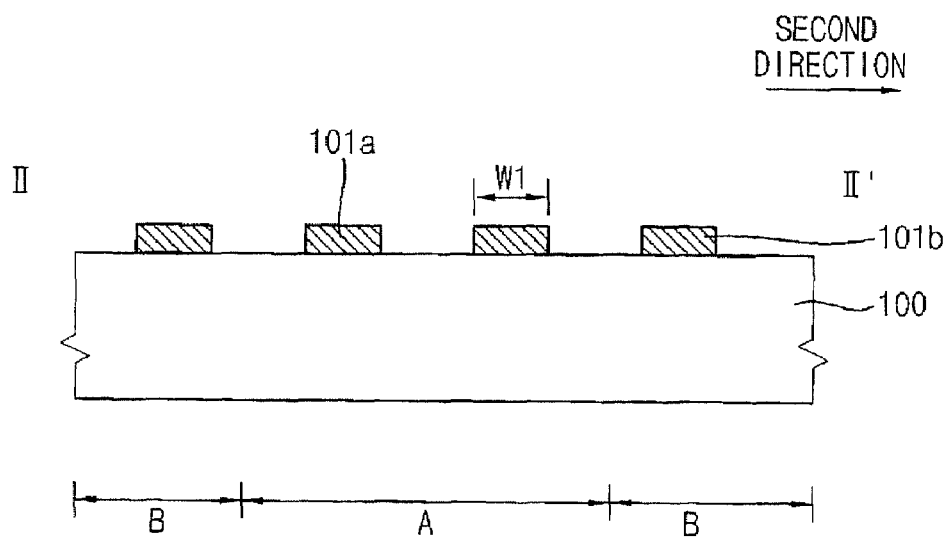
FIGS. 8, 11, 14, 18, 22 and 26 are cross-sectional views taken along II-II' line in FIGS. 6, 9, 12, 16, 20 and 24, respectively.

Referring to FIGS. 6 to 8, an insulating structure 100 having a fuse region A and a wire region B is formed on an integrated circuit substrate such as a semiconductor substrate. The insulating structure 100 may include an oxide such as silicon oxide. Alternatively, the insulating structure 100 includes a nitride such as silicon nitride.

Although not illustrated in FIGS. 6 to 8, a contact electrically connected to a conductive structure that is located in the substrate under the insulating structure 100 may be formed through the insulating structure 100. The conductive structure may be a transistor, a capacitor, a wire pattern, a word line, a bit line, a source region or a drain region.

At least one fuse pattern 101a and at least one first wire pattern 101b are formed on the insulating structure 100. The fuse pattern 101a and the first wire pattern 101b may include a metal such as aluminum. Alternatively, the fuse pattern 101a and the first wire pattern 101b may include polysilicon doped with impurities.

The fuse pattern 101a may extend on the fuse region A and the wire region B in a first direction. In addition, the fuse pattern 101a may have a first width W1 in a second direction substantially perpendicular to the first direction. The first wire pattern 101b may extend on the wire region B in the first direction. The fuse pattern 101a may be spaced apart from the first wire pattern 101b in the second direction. In case that the number of fuse patterns 101a is at least two, the fuse patterns 101a may be spaced apart from one another in the second direction. In case that the number of first wire patterns 101b is at least two, the fuse patterns 101a may be spaced apart from one another in the second direction.

Figure 9:
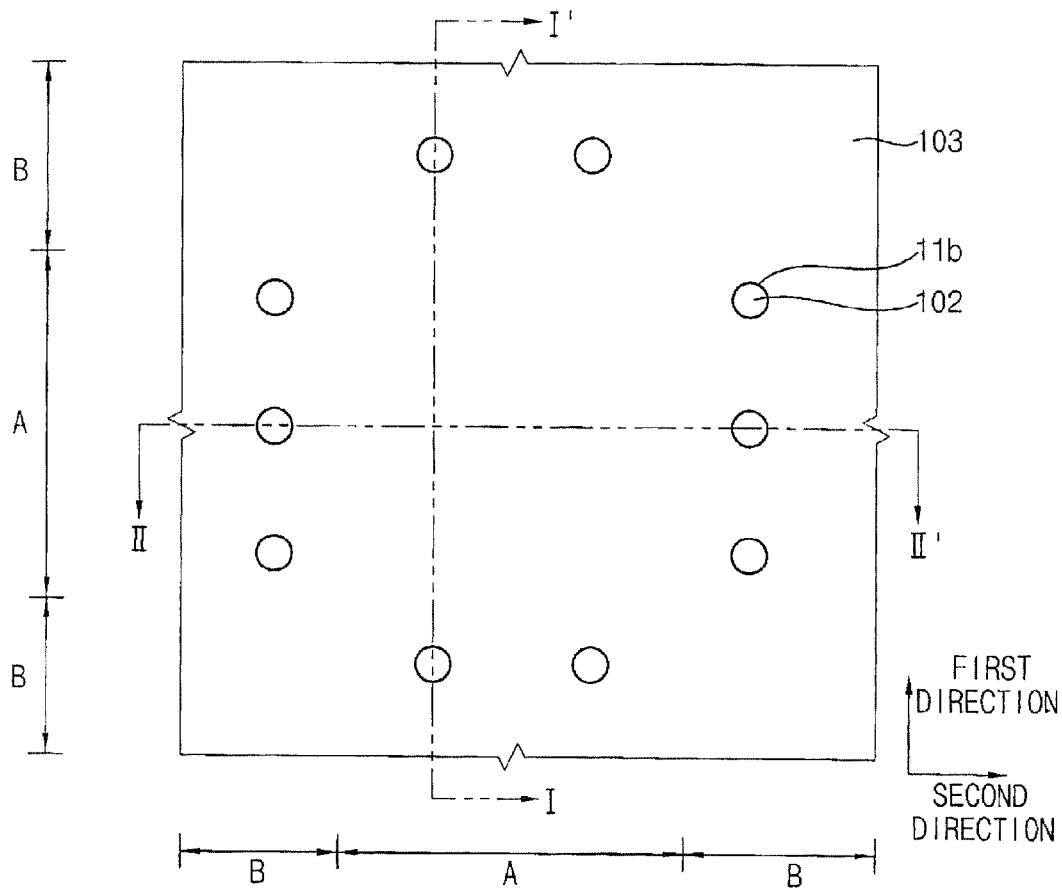
Figure 10:
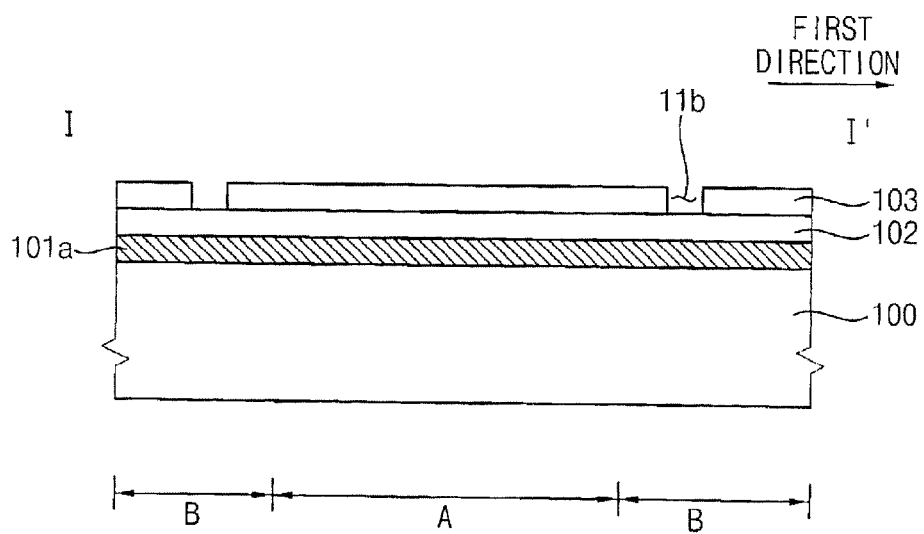
Figure 11:
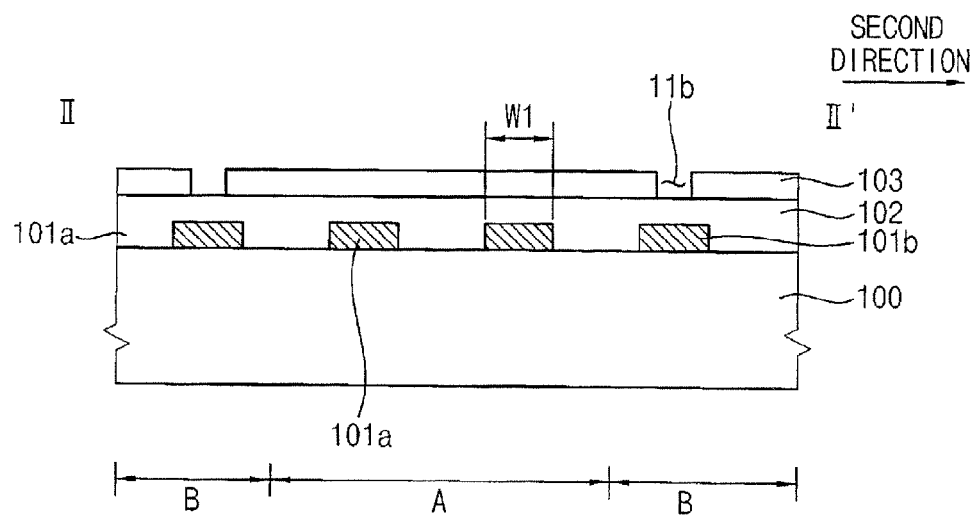
Figure 12:
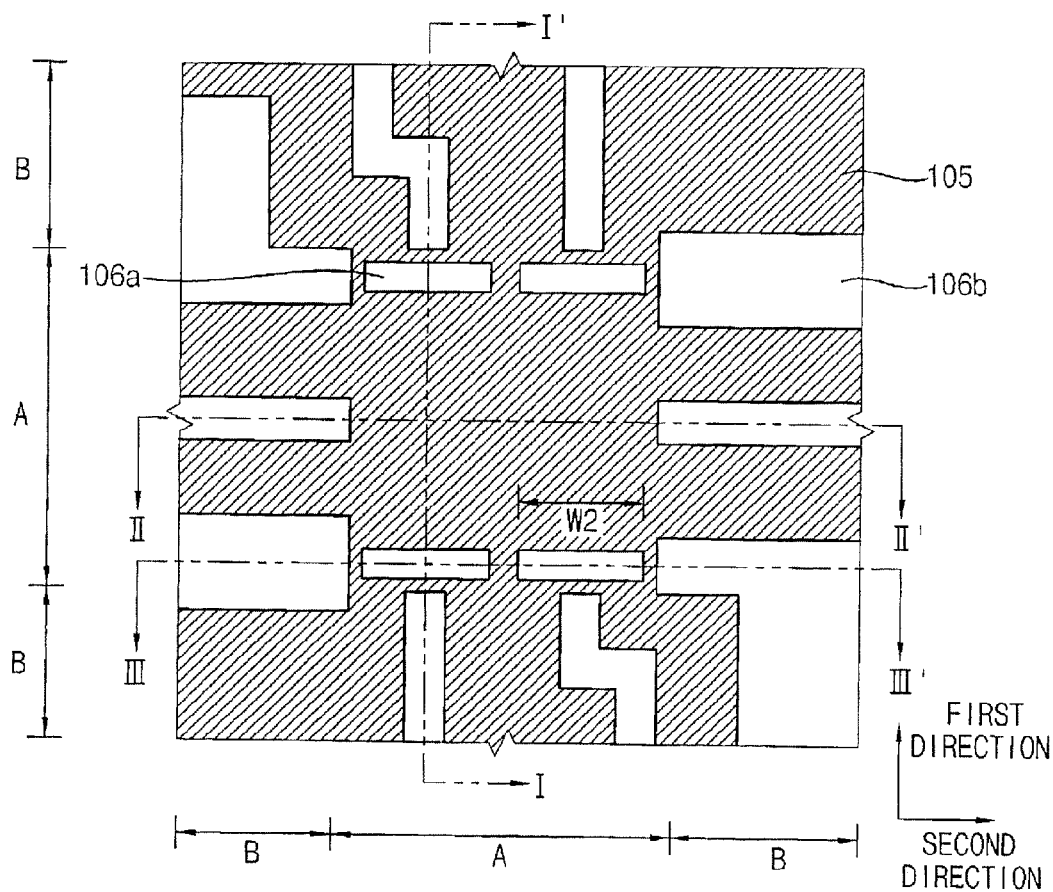
Figure 13:
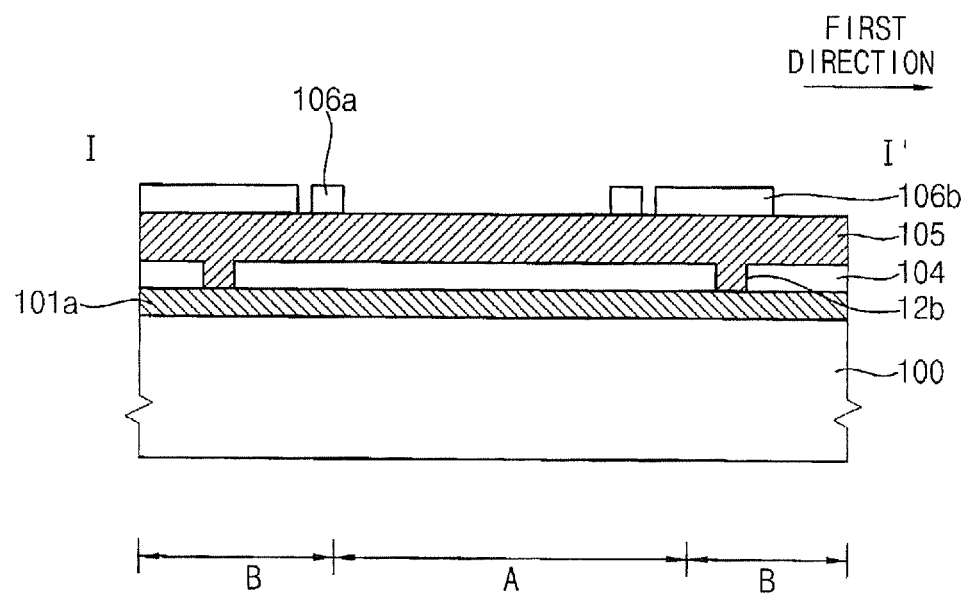
Figure 14:
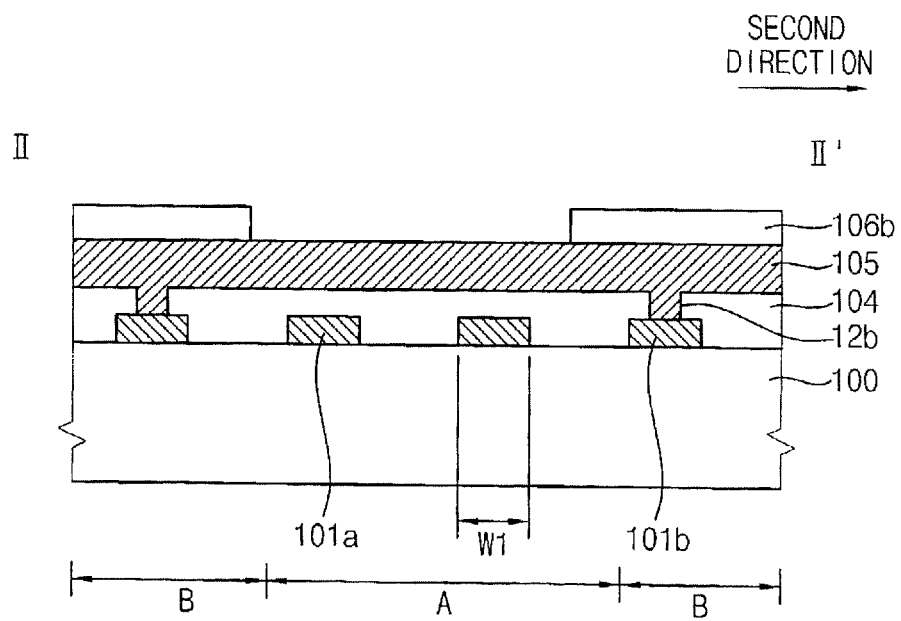
Figure 15:
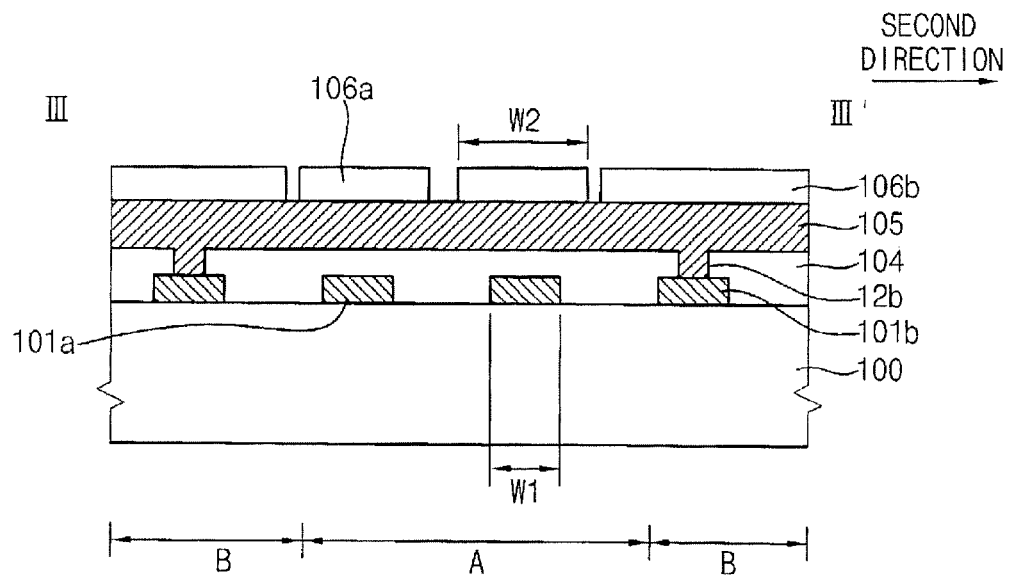
FIGS. 15, 19, 23 and 27 are cross-sectional views taken along III-III' line in FIGS. 12, 16, 20 and 24, respectively.
Figure 16:
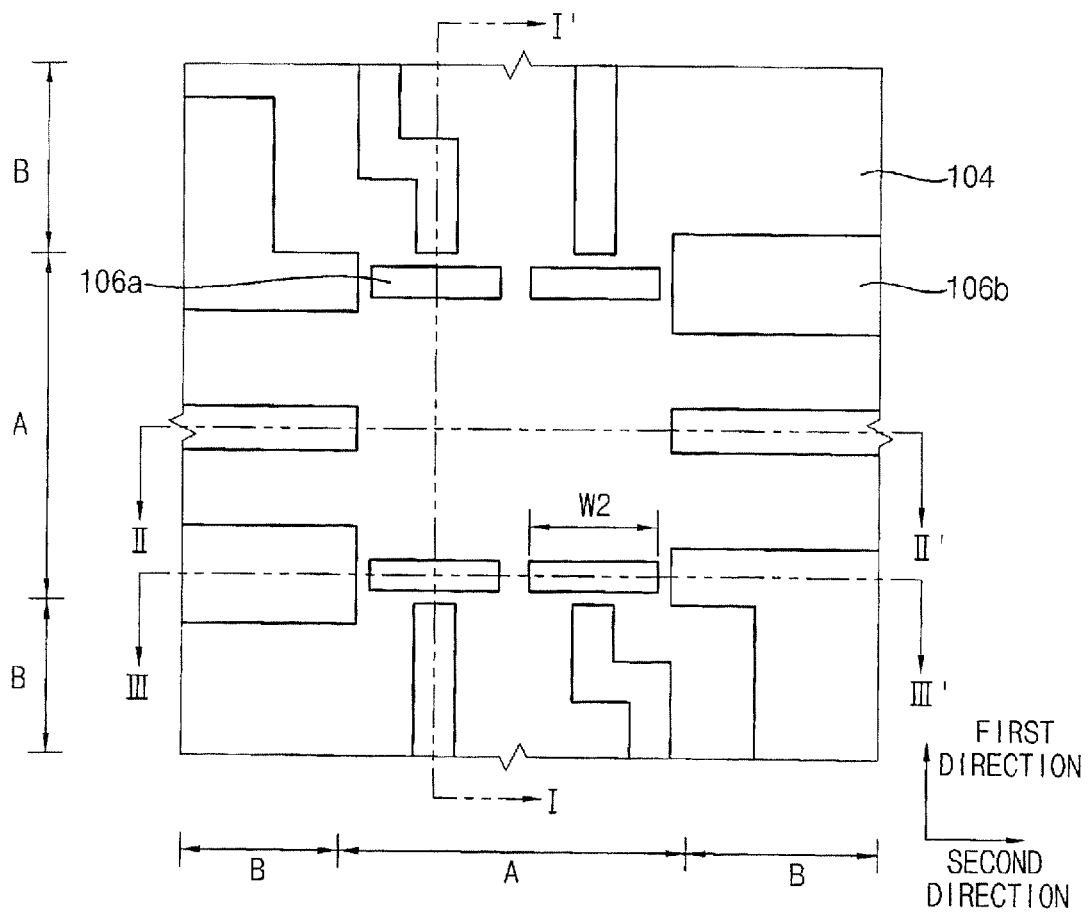
Figure 17:
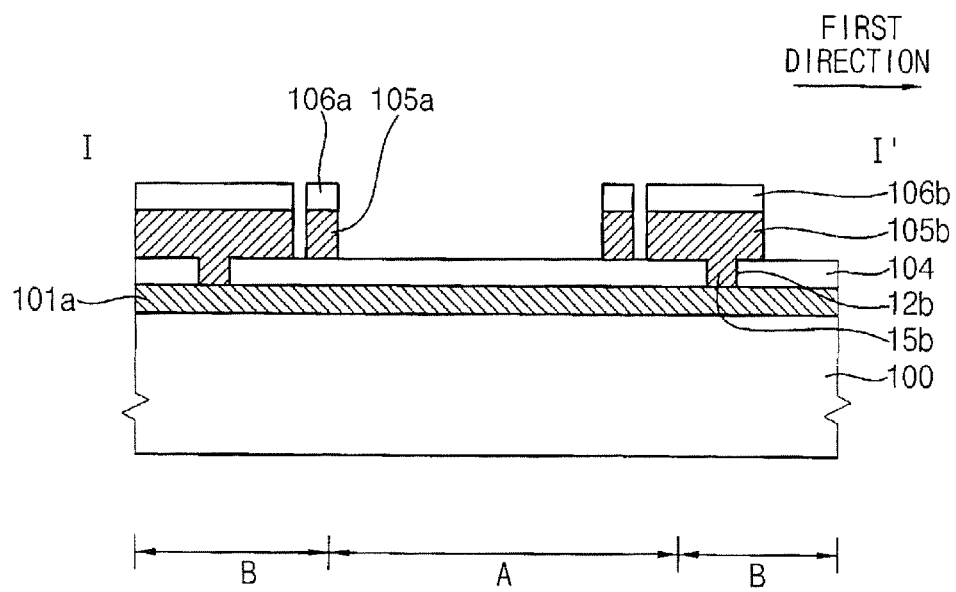
Figure 18:
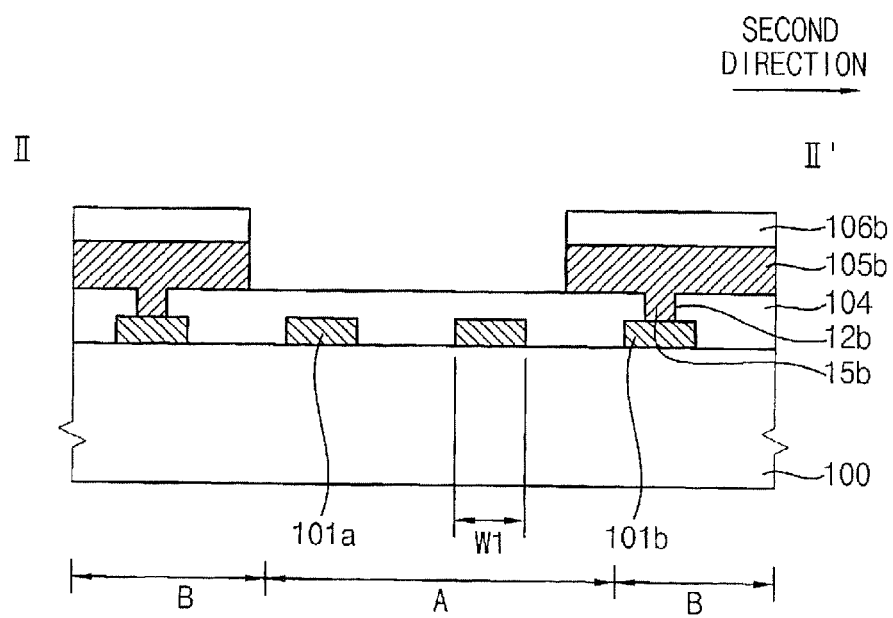
Figure 19:
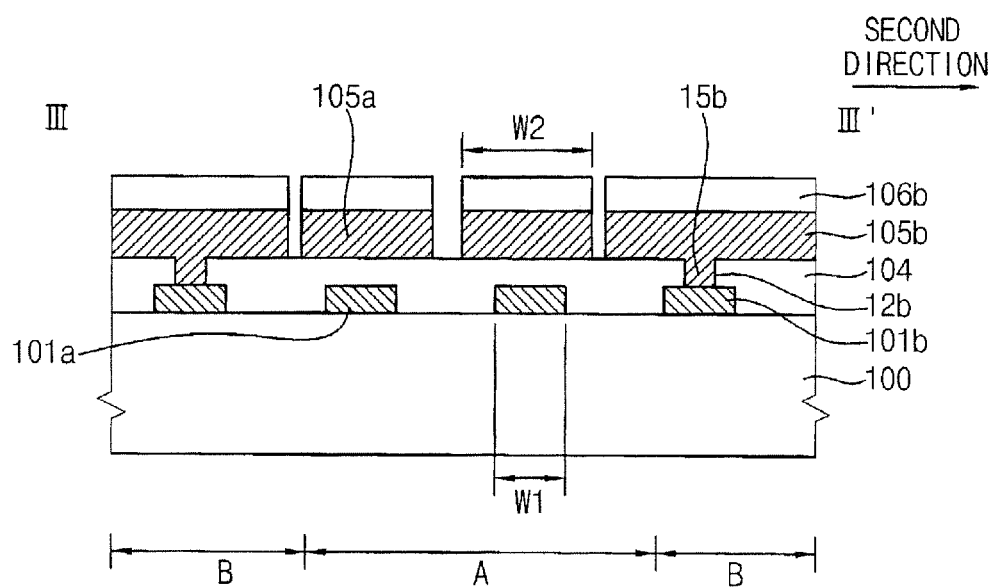
Figure 20:
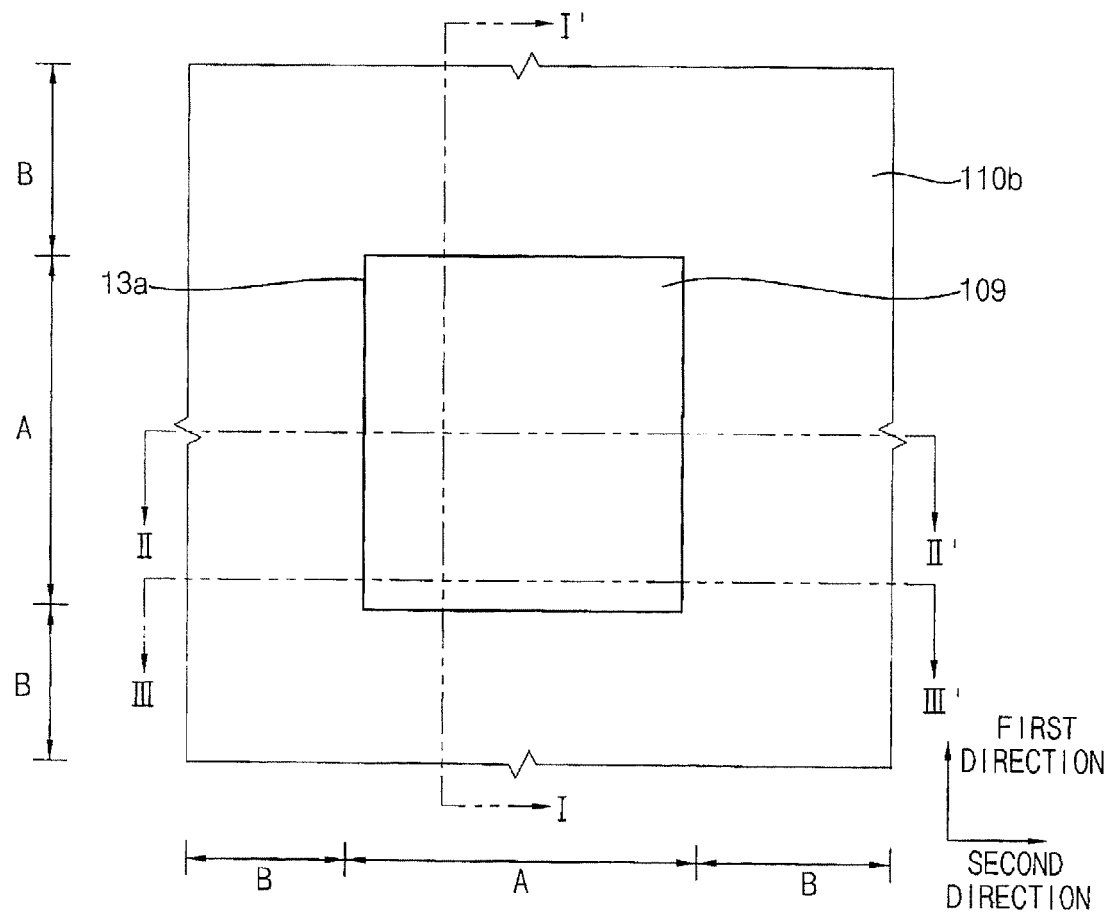
Figure 21:
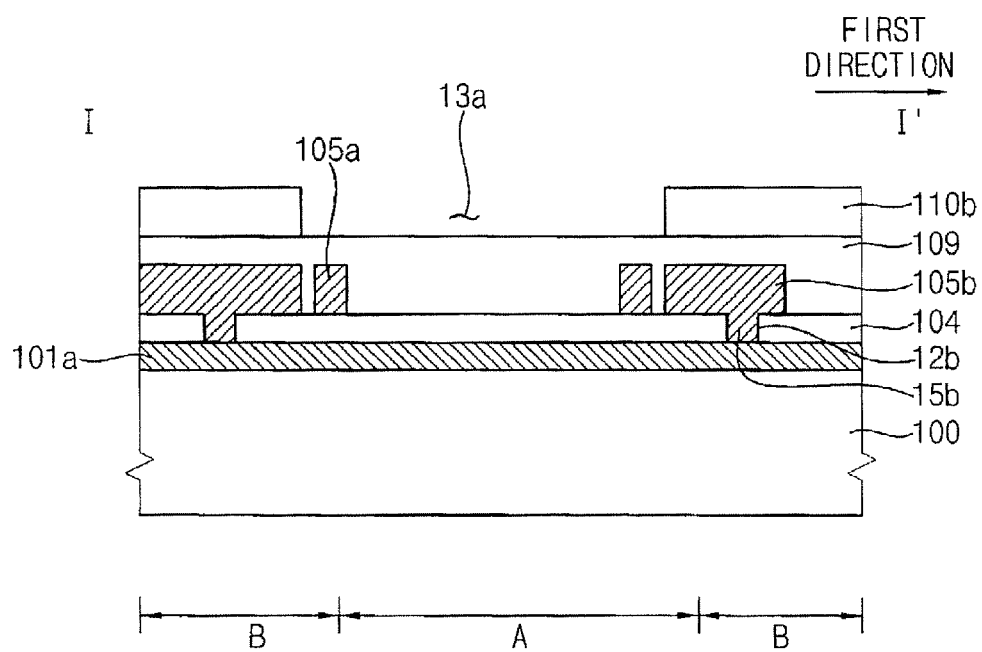
Figure 22:
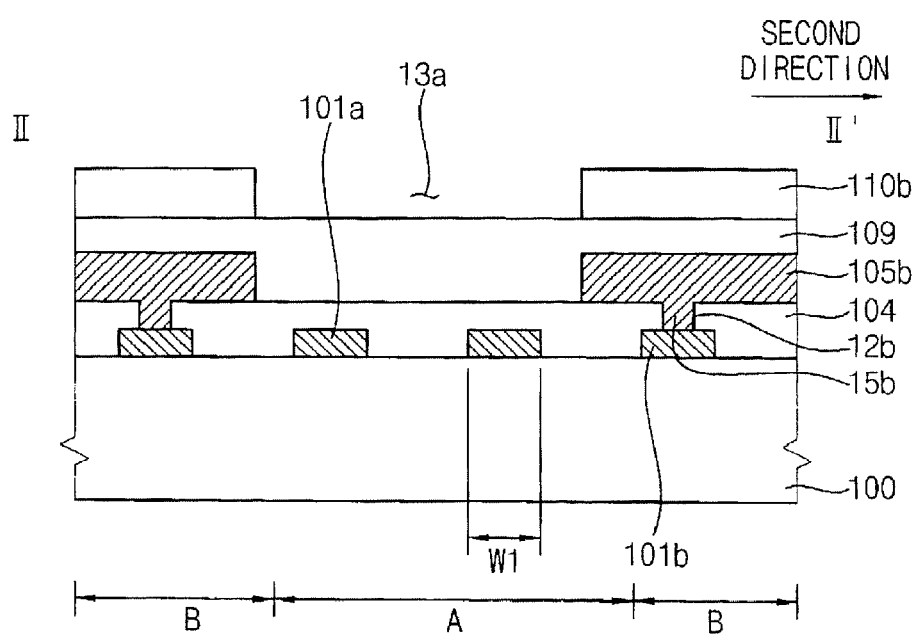
Figure 23:
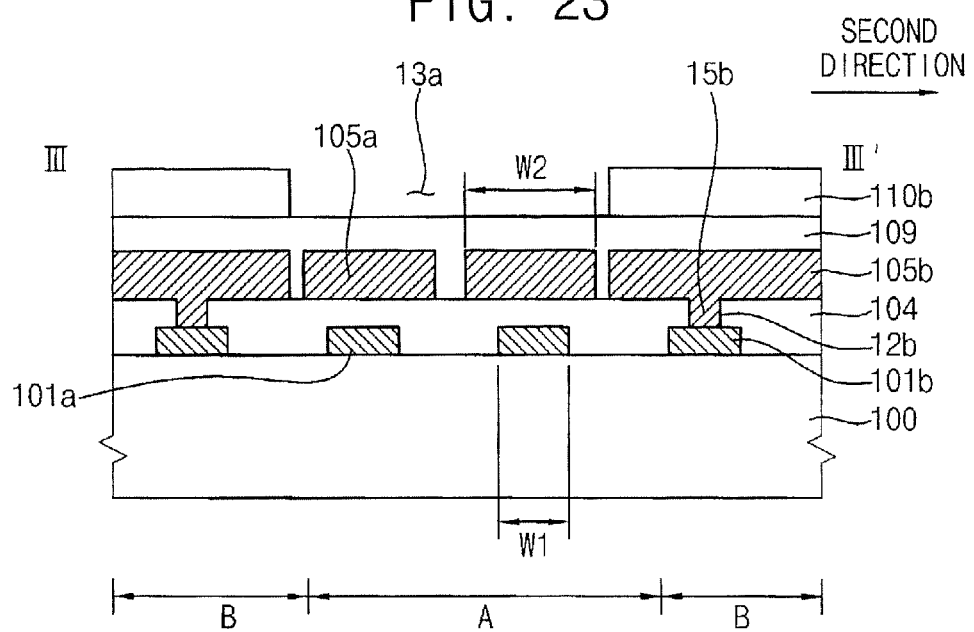

Referring to FIGS. 9 to 11, a first insulating layer 102 is formed on the insulating structure 100 to cover the fuse pattern 101a and the first wire pattern 101b. The first insulating layer 102 may include an oxide such as silicon oxide. Alternatively, the first insulating layer 102 includes a nitride such as silicon nitride.

A first mask pattern 103 is formed on the first insulating layer 102. The first mask pattern 103 may have at least one first hole 11b formed over the wire region B.

The first insulating layer 102 and the first mask pattern 103 may include substantially different materials to achieve an etching selectivity. In one example, the first insulating layer 102 and the first mask pattern 103 include silicon oxide and silicon nitride, respectively. In another example, the first insulating layer 102 and the first mask pattern 103 may include silicon nitride and silicon oxide, respectively.

Referring to FIGS. 12 to 15, a first etching process is performed on the first insulating layer 102 by using the first mask pattern 103 as an etch mask. The first insulating layer 102 may be transformed into a preliminary first insulating pattern 104 having at least one second hole 12b by the first etching process. The second hole 12b may be located over the wire region B. Particularly, the second hole 12b may correspond to the first hole 11b vertically so as to communicate with the first hole 11b. The second hole 12b may expose the fuse pattern 101a or the first wire pattern 101b.

The first mask pattern 103 is removed from the preliminary first insulating pattern 104. The first mask pattern 103 may be removed by an ashing process or a strip process. These may be used alone or in a combination.

A conductive layer 105 is formed on the preliminary first insulating pattern 104 to fill up the second hole 12b. The conductive layer 105 may include a metal such as aluminum. Alternatively, the conductive layer 105 includes polysilicon doped with impurities.

At least one second mask pattern 106a and at least one third mask pattern 106b are formed on the conductive layer 105. The second mask pattern 106a is formed over the fuse region A. The second mask pattern 106a may have a second width W2 in the second direction. The second width W2 may be substantially greater than the first width W1. The third mask pattern 106b is located over the wire region B. In addition, the third mask pattern 106b is located over the second hole 12b.

The second mask pattern 106a is spaced apart from the third mask pattern 106b. In case that the number of second mask patterns 106a is at least two, the second mask patterns 106a may be spaced apart from one another. In case that the number of third mask patterns 106b is at least two, the third mask patterns 106b may be spaced apart from one another.

A material included in the second and third mask patterns 106a and 106b may be substantially different from that included in the conductive layer 105 to achieve an etching selectivity. In one example, the second and third mask patterns 106a and 106b include an oxide such as silicon oxide. In another example, the second and third mask patterns 106a and 106b include a nitride such as silicon nitride.

Referring to FIGS. 16 to 19, a second etching process is performed on the conductive layer 105 until the preliminary first insulating pattern 104 is exposed. The second mask pattern 106a and the third mask pattern 106b together may be used as an etch mask in the second etching process. The conductive layer 105 may be transformed into at least one upper protecting pattern 105a and at least one second wire pattern 105b by the second etching process.

The upper protecting pattern 105a and the second wire pattern 105b may be located under the second mask pattern 106a and the third mask pattern 106b, respectively. Particularly, the upper protecting pattern 105a is located over the fuse region A. The preliminary first insulating pattern 104 located between the upper protecting pattern 105a and the fuse pattern 101a may insulate the upper protecting pattern 105a from the fuse pattern 101a.

The upper protecting pattern 105a has a second width W2 in the second direction. The second wire pattern 105b is located over the wire region B. The second wire pattern 105b has a lower portion 15b filling up the second hole 12b. Thus, the second wire pattern 105b may be electrically connected to the fuse pattern 101a or the first wire pattern 101b.

The upper protecting pattern 105a may be spaced apart from the second wire pattern 105b. In case that the number of upper protecting patterns 105a is at least two, the upper protecting patterns 105a may be spaced apart from one another. In case that the number of second wire patterns 105b is at least two, the second wire patterns 105b may be spaced apart from one another.

Referring to FIGS. 20 to 23, the second mask pattern 106a and the third mask pattern 106b are removed from the upper protecting pattern 105a and the second wire pattern 105b, respectively. The second mask pattern 106a and the third mask pattern 106b may be removed by an ashing process or a strip process. These may be used alone or in a combination.

A second insulating layer 109 is formed on the preliminary first insulating pattern 104 to cover the upper protecting pattern 105a and the second wire pattern 105b. The second insulating layer 109 may include an oxide such as silicon oxide. Alternatively, the second insulating layer 109 may include a nitride such as silicon nitride.

A fourth mask pattern 110b is formed on the second insulating layer 109. The fourth mask pattern 110b may include a material substantially different from that included in the second insulating layer 109 and the preliminary first insulating pattern 104 to achieve an etching selectivity. In one example, the fourth mask pattern 110b includes an oxide such as silicon oxide. In another example, the fourth mask pattern 110b includes a nitride such as silicon nitride.

The fourth mask pattern 110b has a third hole 13a. The third hole 13a may vertically correspond to the fuse region A. Thus, a portion of the second insulating layer 109 vertically corresponding to the fuse region A may be exposed through the third hole 13a.

Referring to FIGS. 24 to 27, a third etching process is performed on the second insulating layer 109 and the preliminary first insulating pattern 104 until the insulating structure 100 is exposed. The fourth mask pattern 110b may be used as an etch mask in the third etching process. The second insulating layer 109 may be transformed into a second insulating pattern 109b by the third etching process. The second insulating pattern 109b may be located over the wire region B. The second insulating pattern 109b may vertically correspond to the wire region B. The preliminary first insulating pattern 104 may be transformed into a first insulating pattern 104b and at least one lower protecting pattern 104a.

The lower protecting pattern 104a is located under the upper protecting pattern 105a. As a result, a fence 111a including the lower protecting pattern 104a and the upper protecting pattern 105a may be formed by the third etching process. The fence 111a may prevent at least some fractures of the fuse pattern 101a from spattering in a direction along which the fuse pattern 101a extends. The fractures of the fuse pattern 101a may be generated when the fuse pattern 101a is cut by a laser.

The first insulating pattern 104b may be located over the wire region B. Particularly, the first insulating pattern 104b may vertically correspond to the wire region B.

The fourth mask pattern 110b is removed from the second insulating pattern 109b. The fourth mask pattern 110b may be removed by an ashing process or a strip process. These may be used alone or in a combination.

Figure 27:
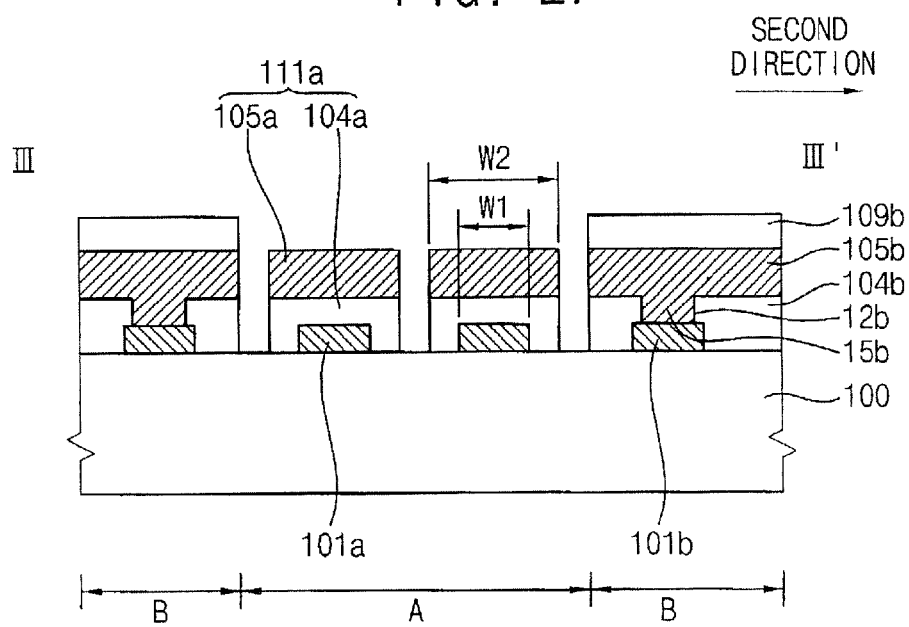

As illustrated in FIG. 27, the fence 111a encloses the fuse pattern 101a in the second direction. That is, the fence 111a is overlapped with the fuse pattern 101a. As illustrated in FIGS. 12 to 27, a position of the fence 111a may be varied in accordance with a position of the second mask pattern 106a. Thus, in case that the position of the second mask pattern 106a varies, the position of the fence 111a may also vary. In one example, the fence 111a may extend between the fuse patterns 101a in the second direction. In another example, the fence 111a may enclose at least two fuse patterns 101a in the second direction. That is, the fence 111a may be overlapped with at least two fuse patterns 101a.

Figure 24:
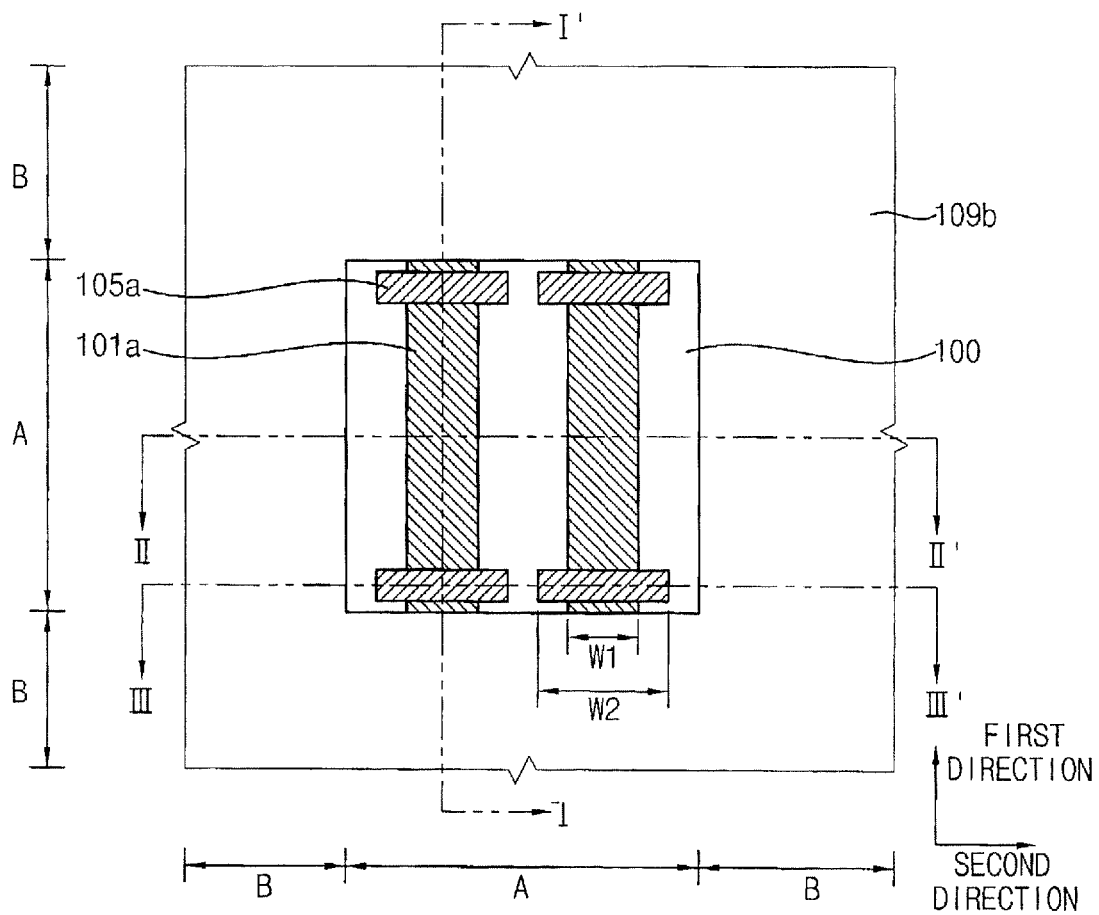
Figure 25:
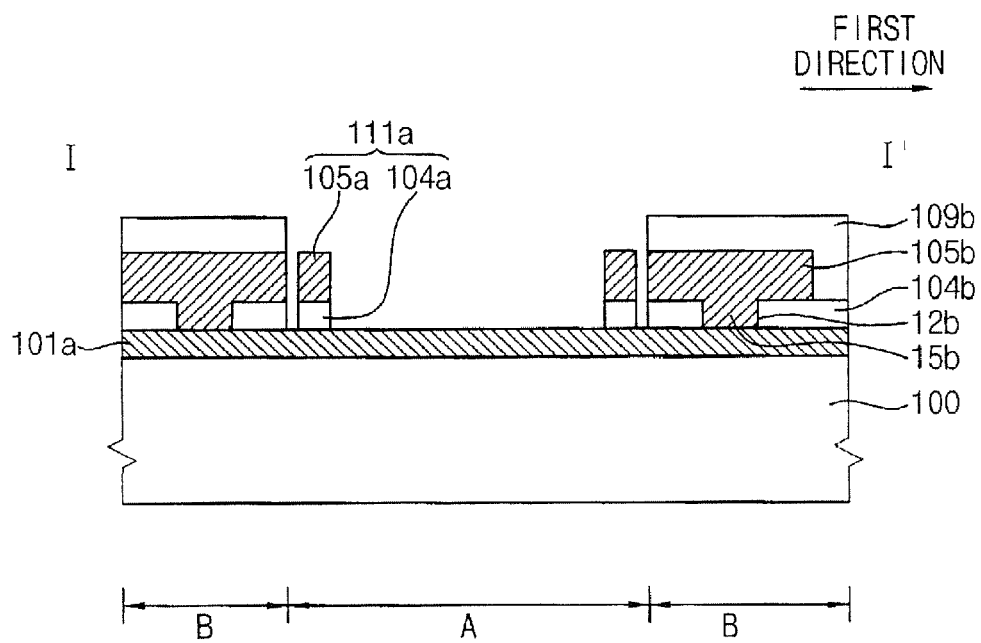
Figure 26:
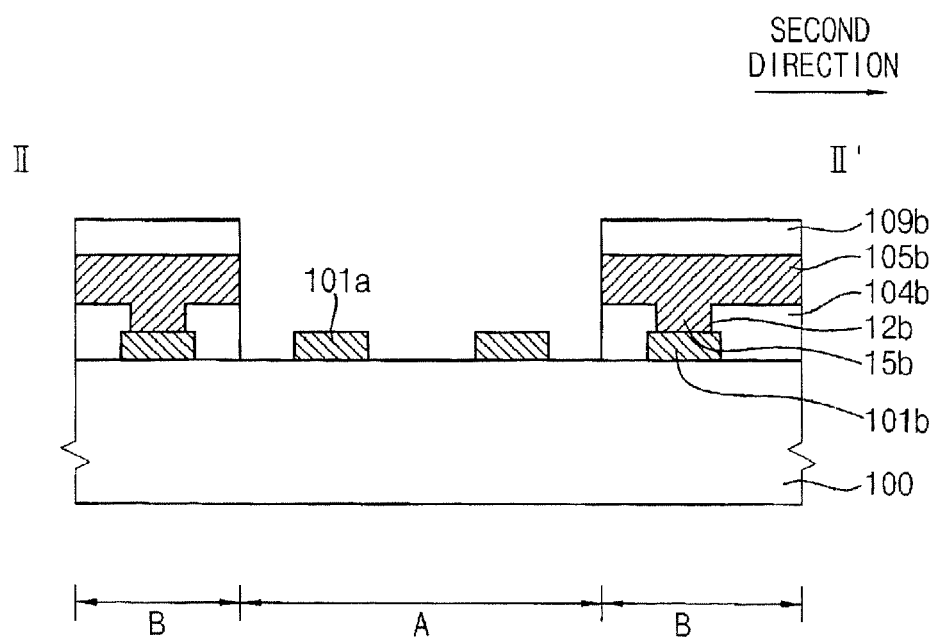

As illustrated in FIGS. 24 and 25, two fences 111a may be formed on the fuse pattern 101a such that two fences 111a face each other. In this case, the laser used to cut the fuse pattern 101a may be irradiated onto a portion of the fuse pattern 101a exposed between the fences 111a.

Figure 28:
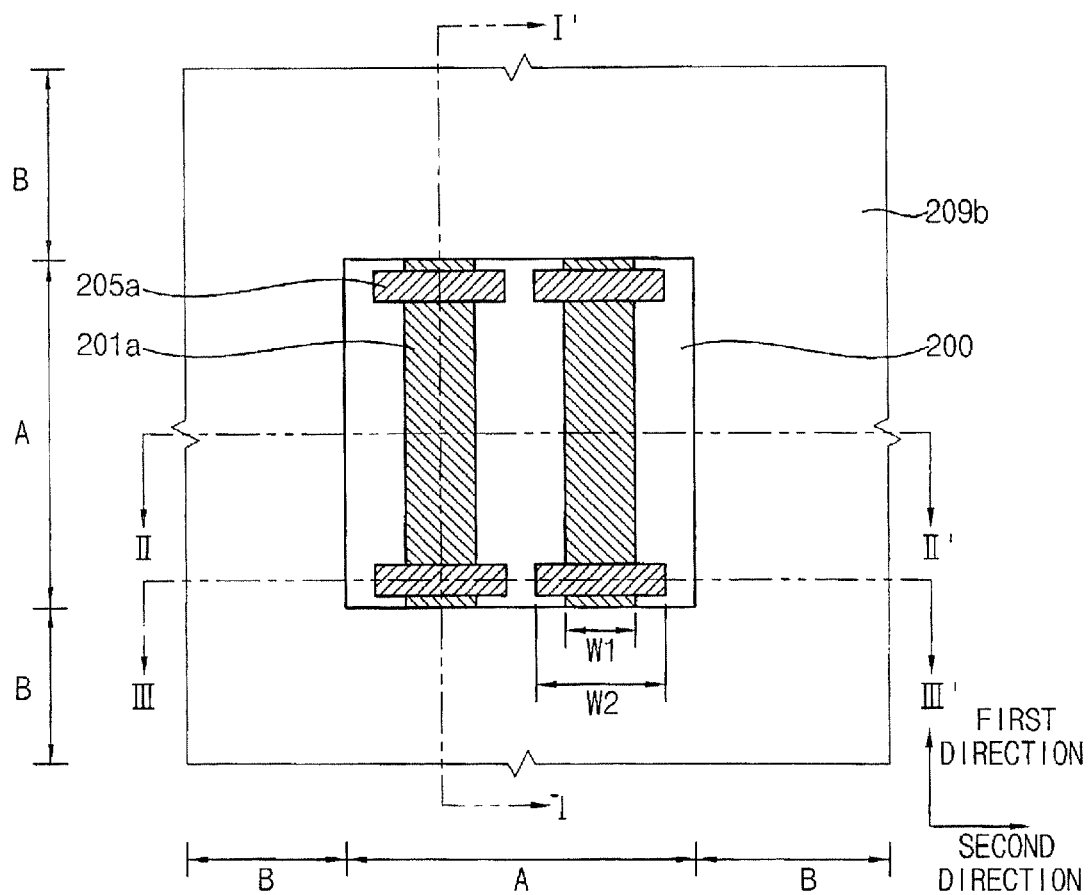
FIG. 28 is a plan view illustrating a fuse structure in accordance with other embodiments of the present invention.
Figure 29:
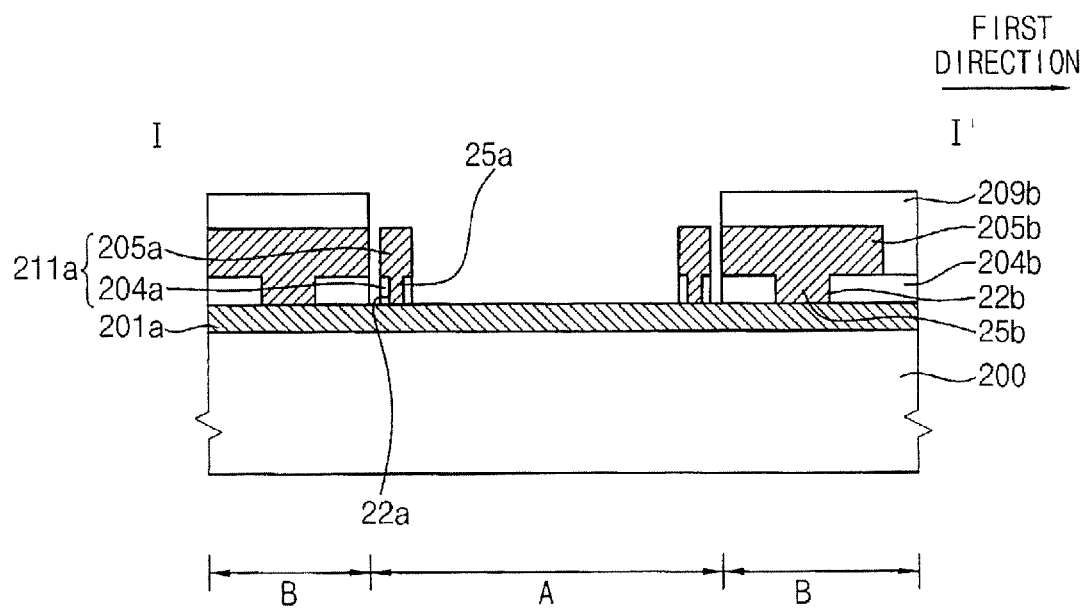
FIG. 29 is a cross-sectional view taken along (-(' line in FIG. 28.
Figure 30:
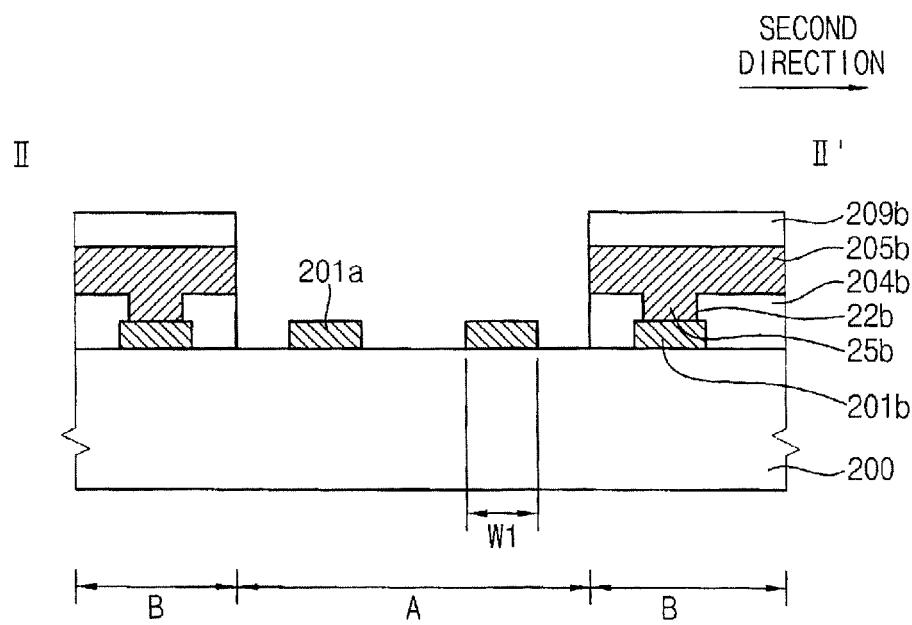
FIG. 30 is a cross-sectional view taken along ((-((' line in FIG. 28.
Figure 31:
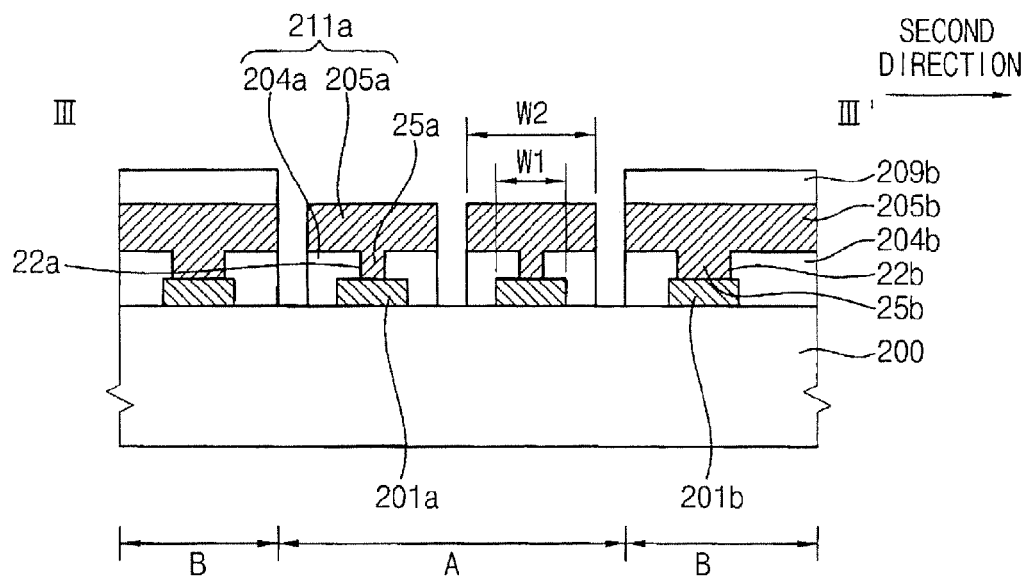
FIG. 31 is a cross-sectional view taken along (((-(((' line in FIG. 28.
Figure 32:
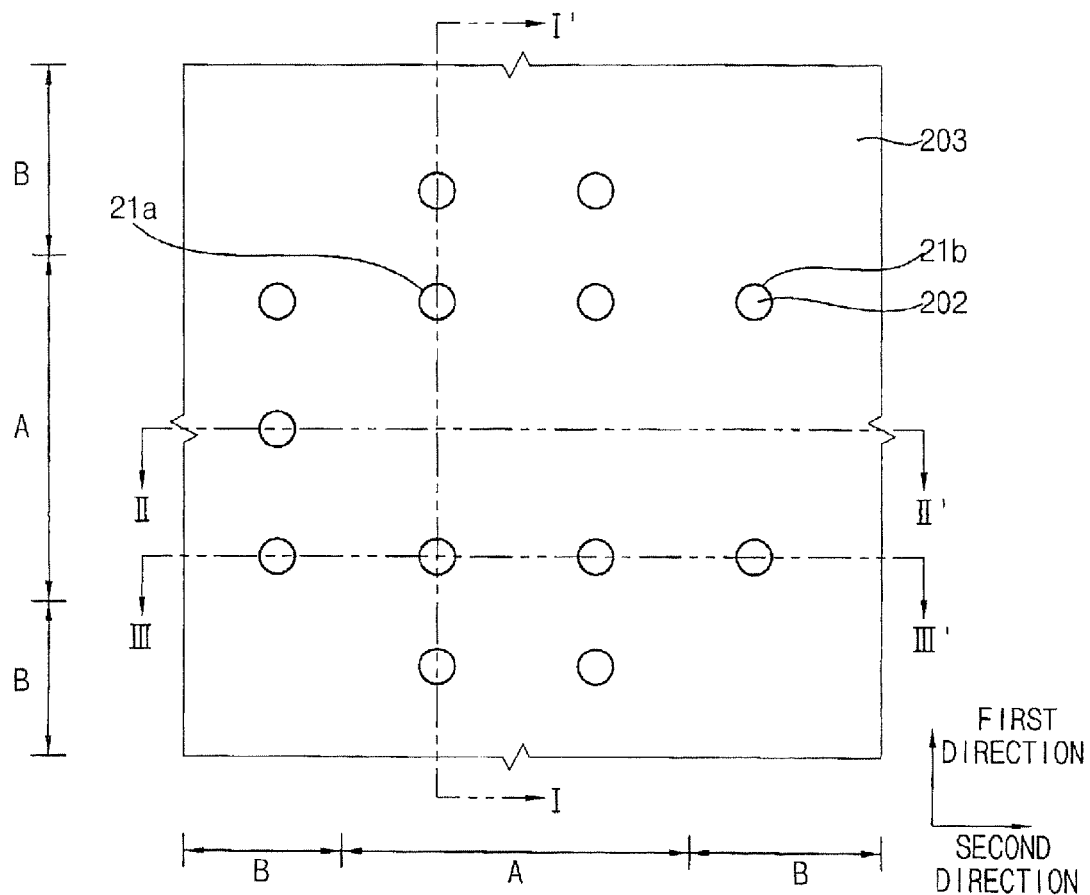
FIGS. 32, 36, 40, 44 and 48 are plan views illustrating methods of forming fuse structures in FIGS. 28 to 31.
Figure 33:
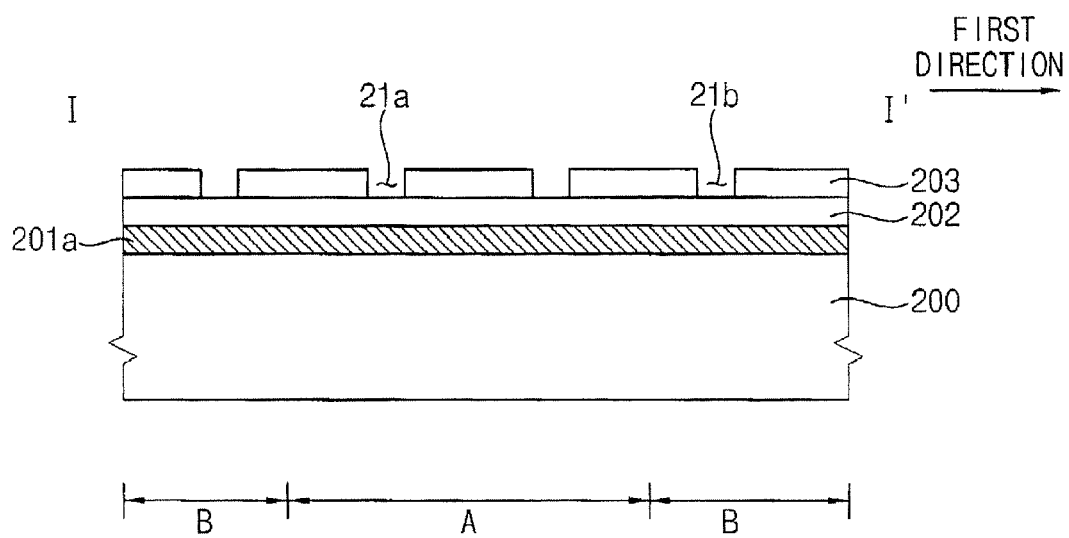
FIGS. 33, 37, 41, 45 and 49 are cross-sectional views taken along (-(' lines in FIGS. 32, 36, 40, 44 and 48, respectively.
Figure 34:
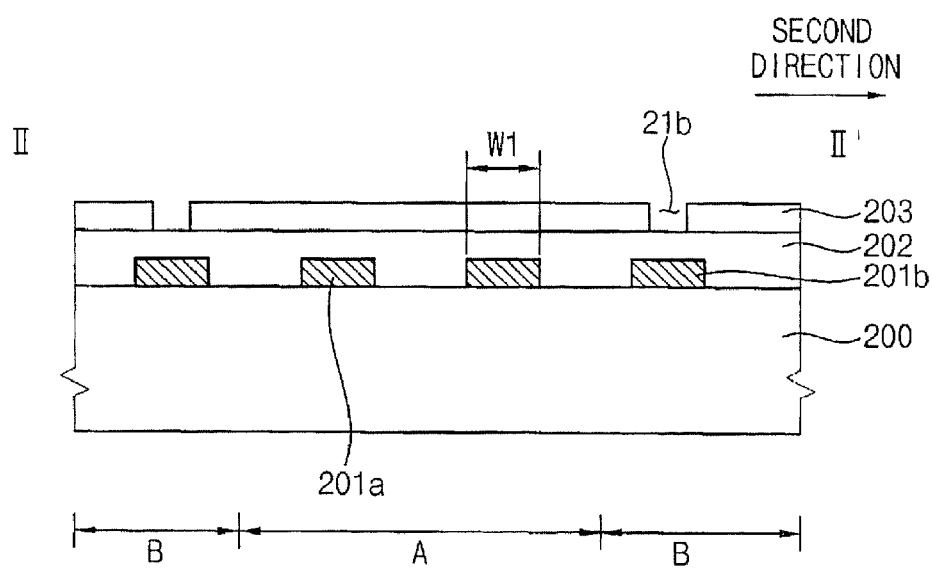
FIGS. 34, 38, 42, 46 and 50 are cross-sectional views taken along ((-((' lines in FIGS. 32, 36, 40, 44 and 48, respectively.
Figure 35:
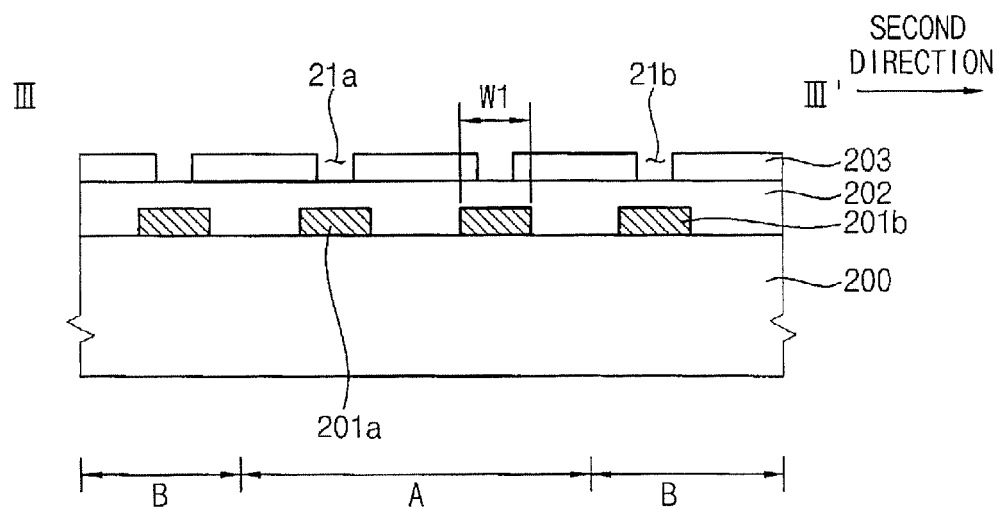
FIGS. 35, 39, 43, 47 and 51 are cross-sectional views taken along (((-(((' lines in FIGS. 32, 36, 40, 44 and 48, respectively.
Figure 36:
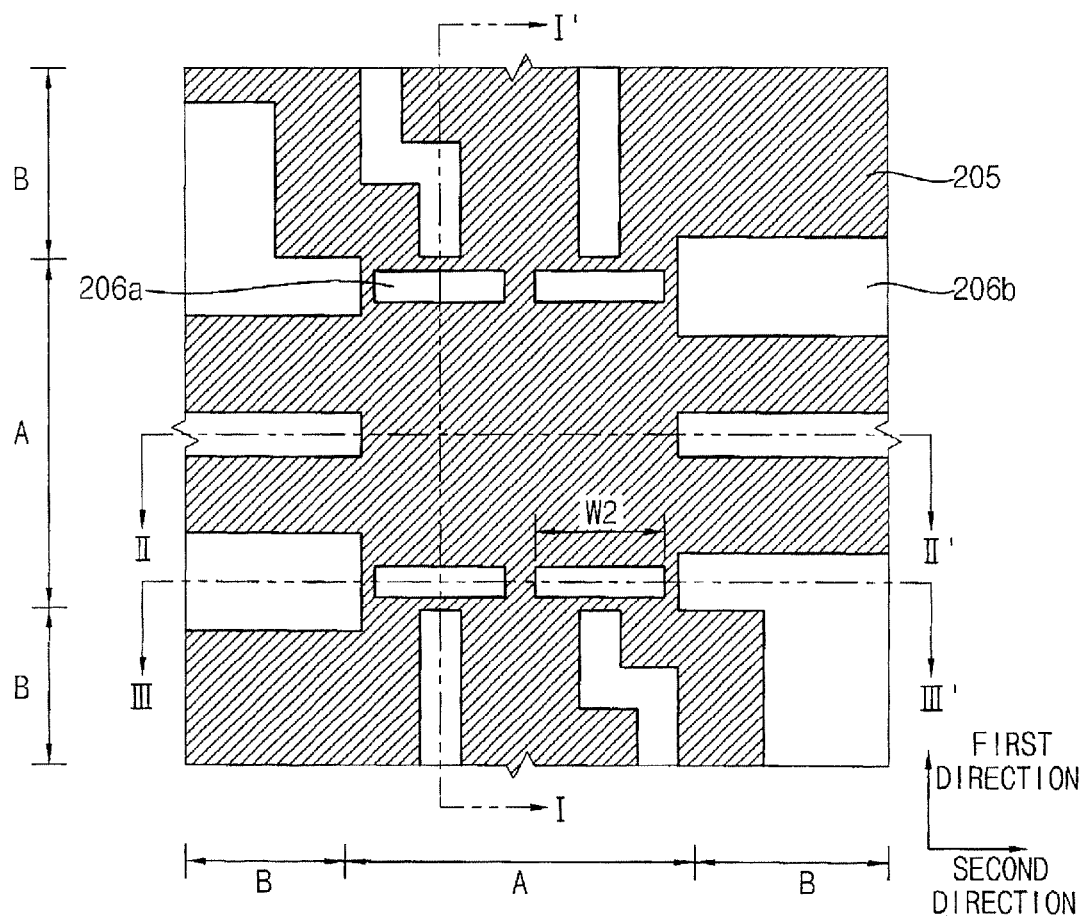
Figure 37:
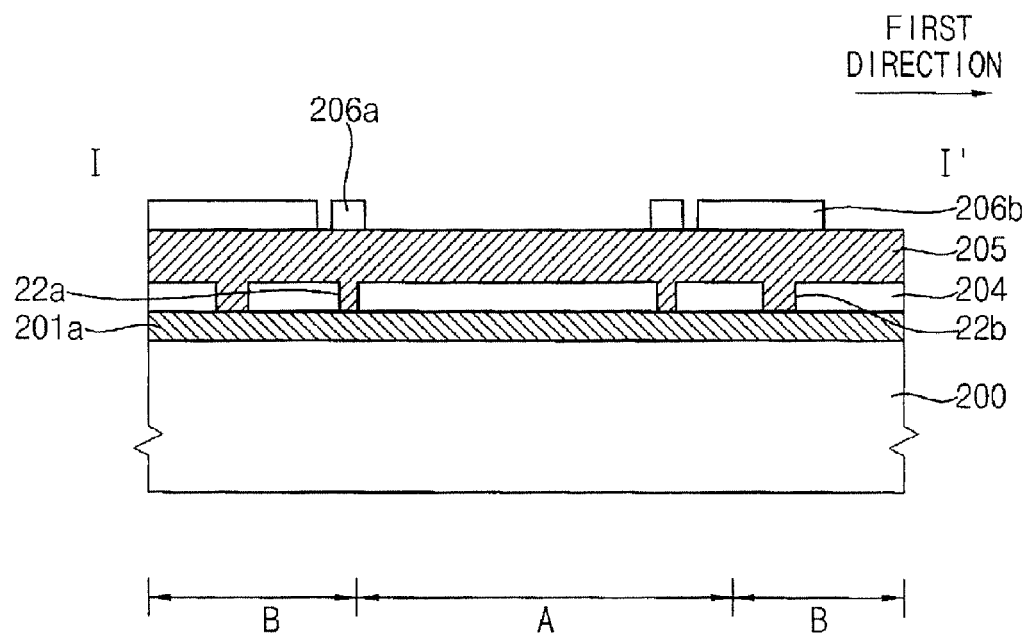
Figure 38:
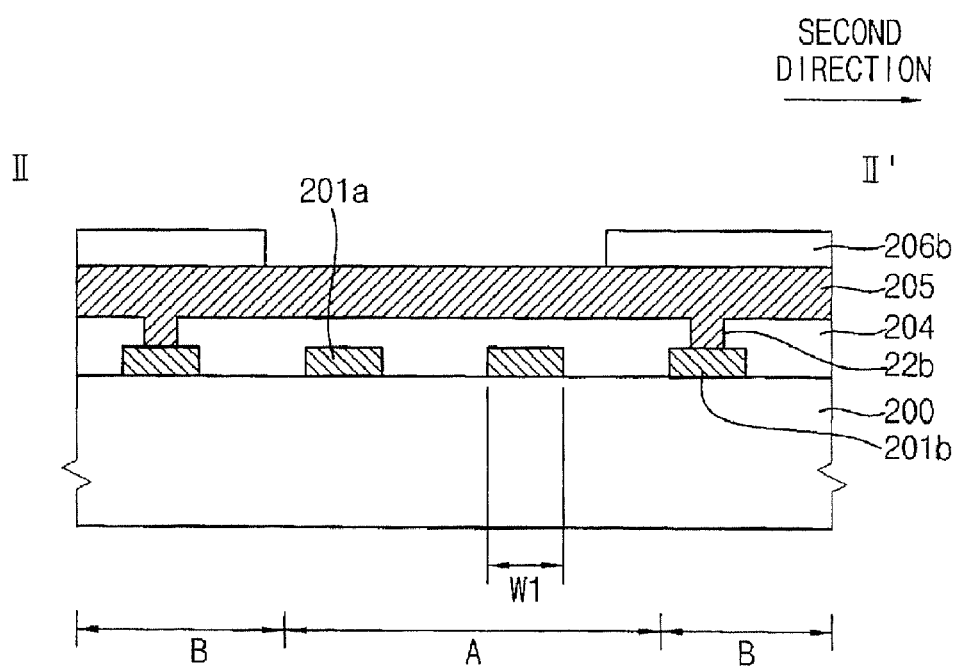
Figure 39:
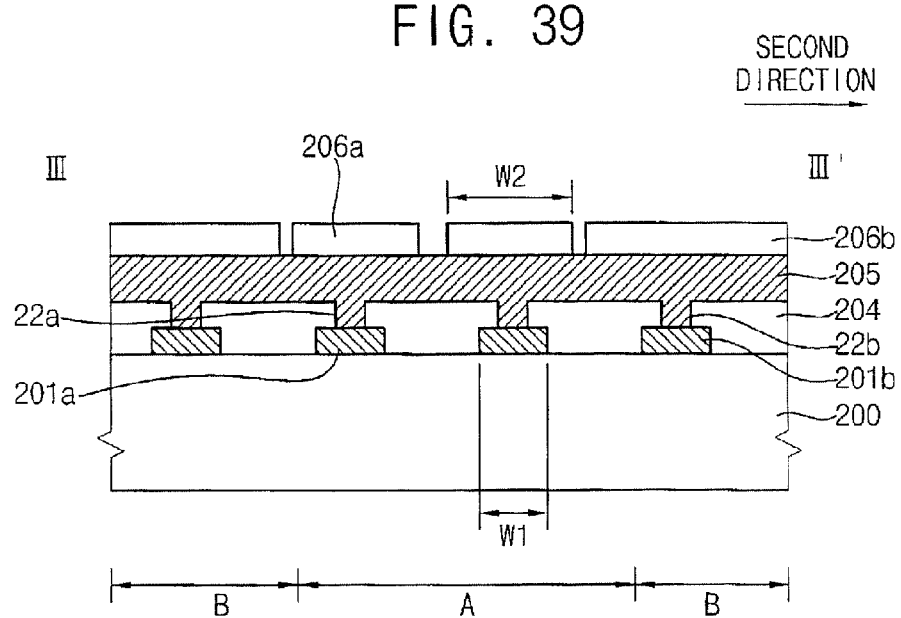
Figure 40:
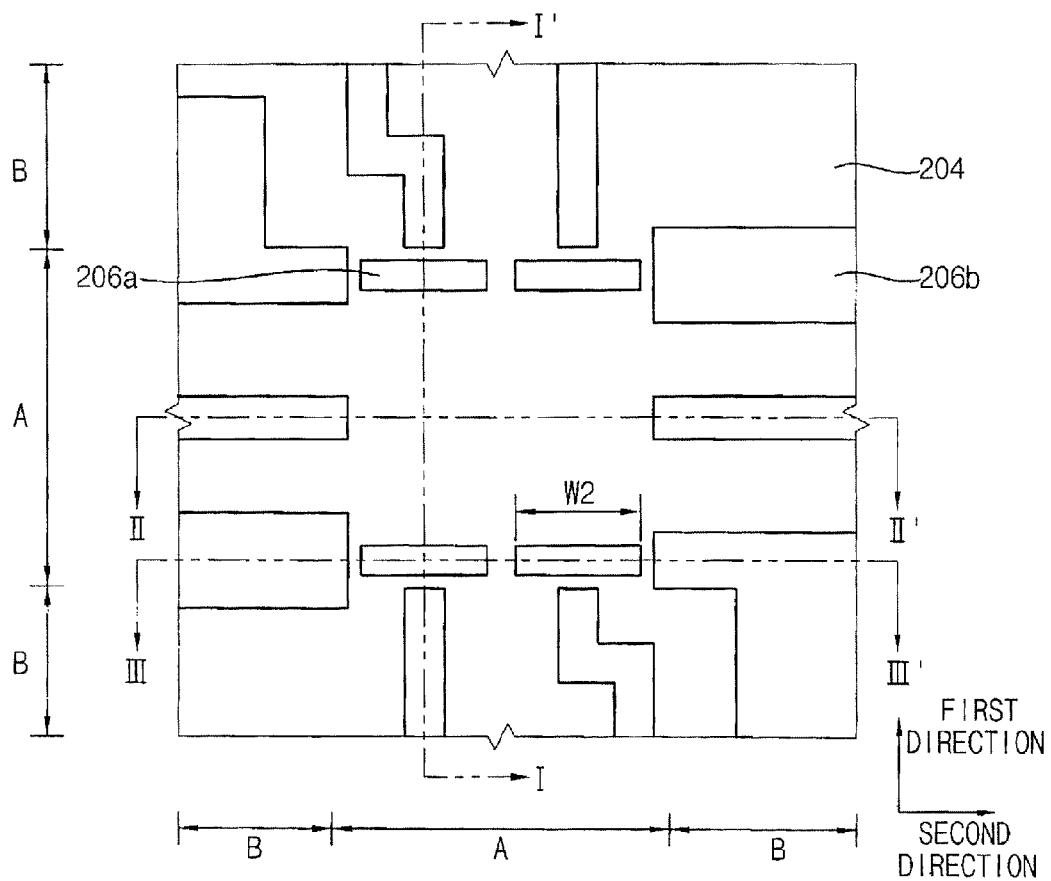
Figure 41:
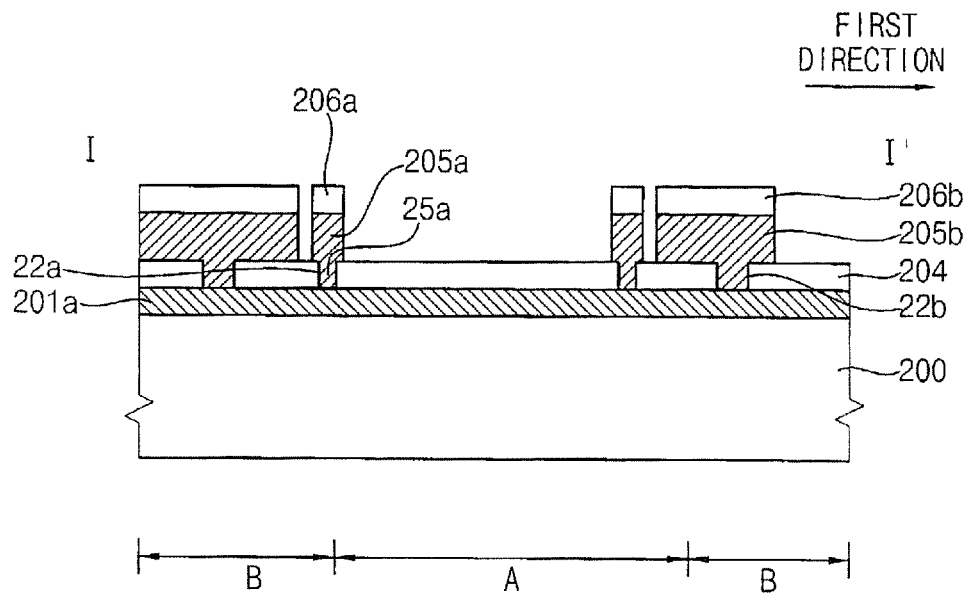
Figure 42:
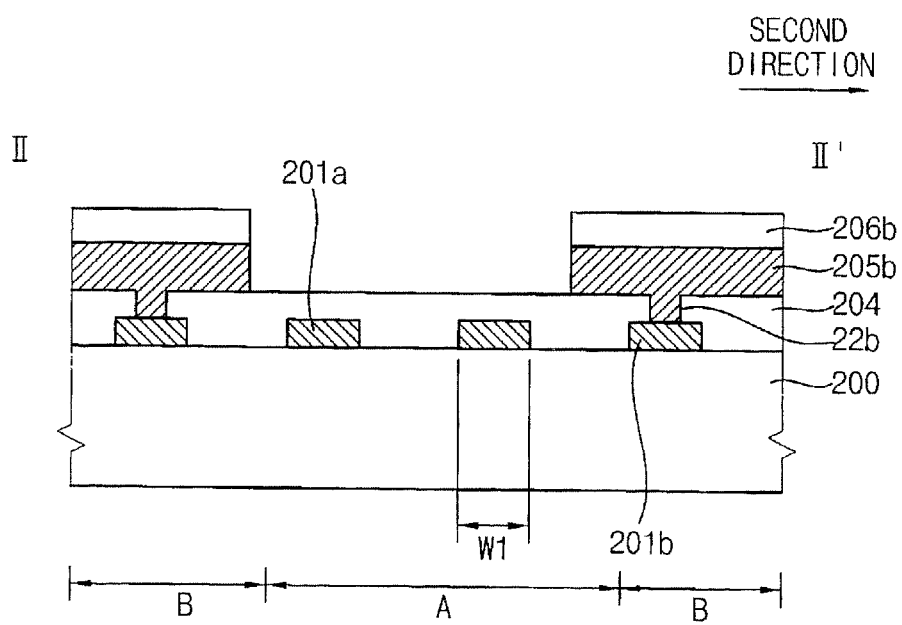
Figure 43:
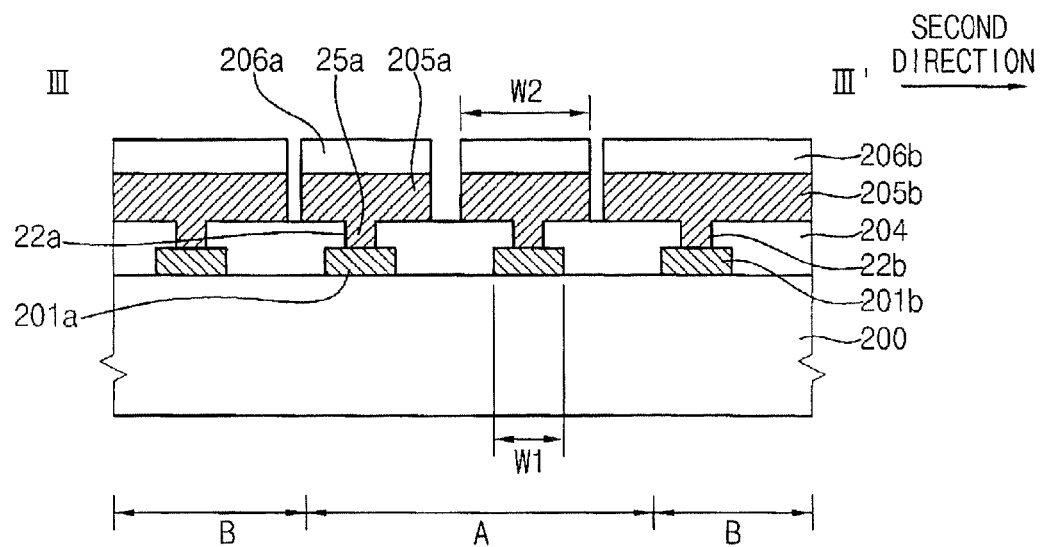
Figure 44:
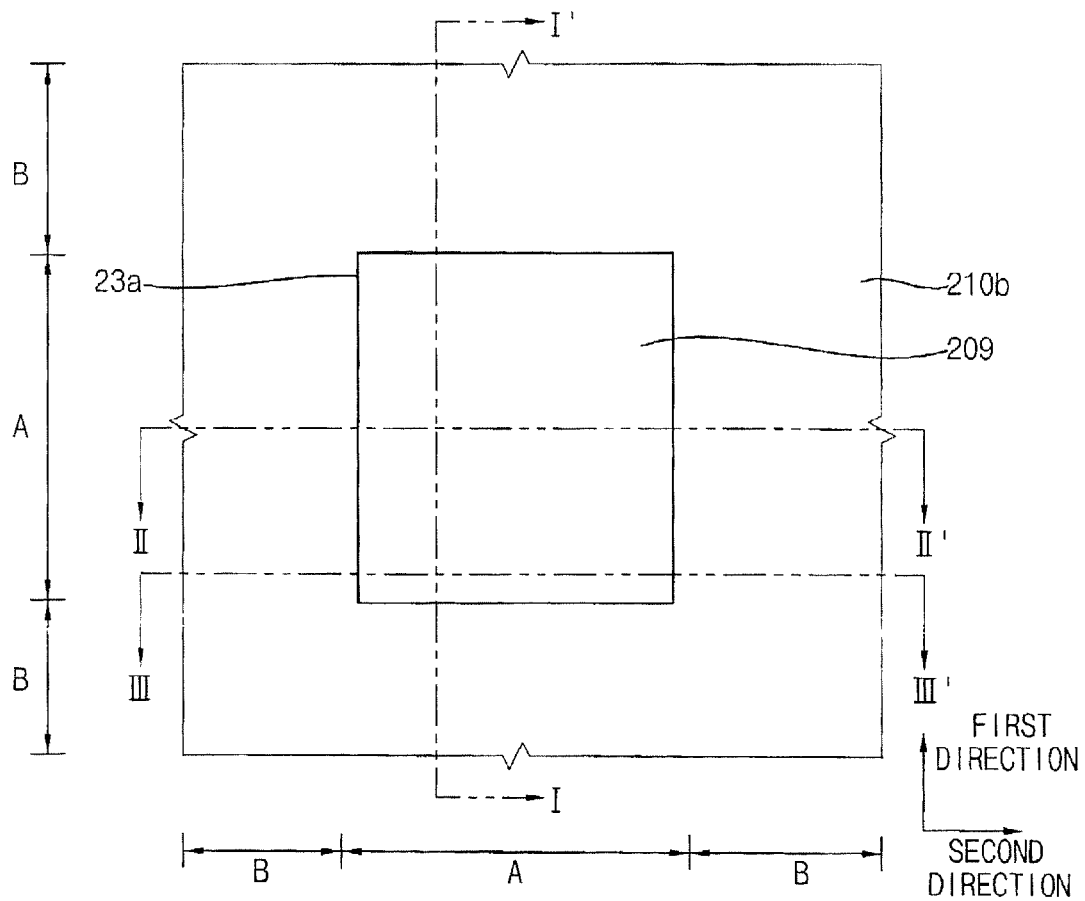
Figure 45:
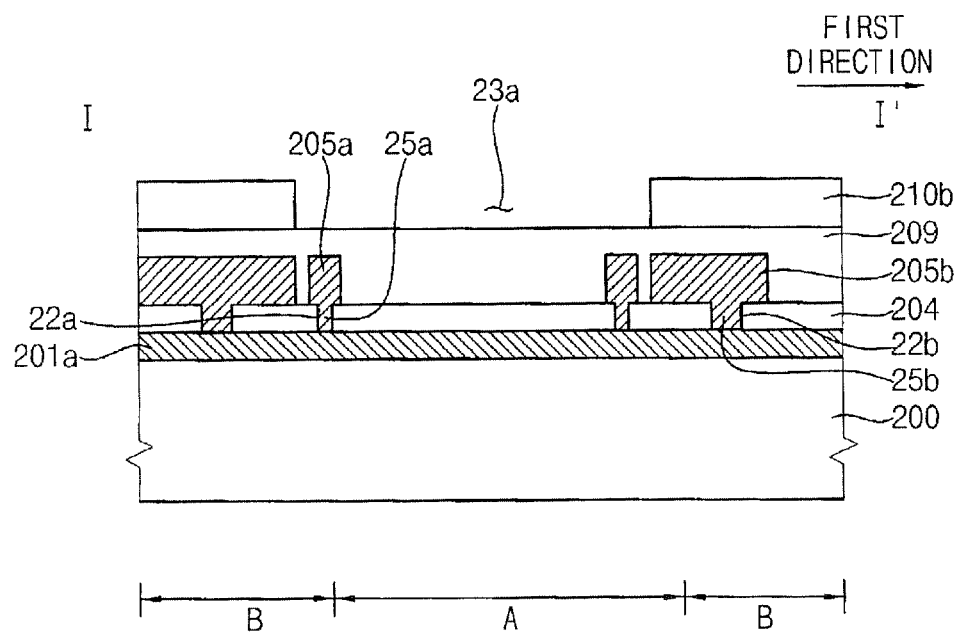
Figure 46:
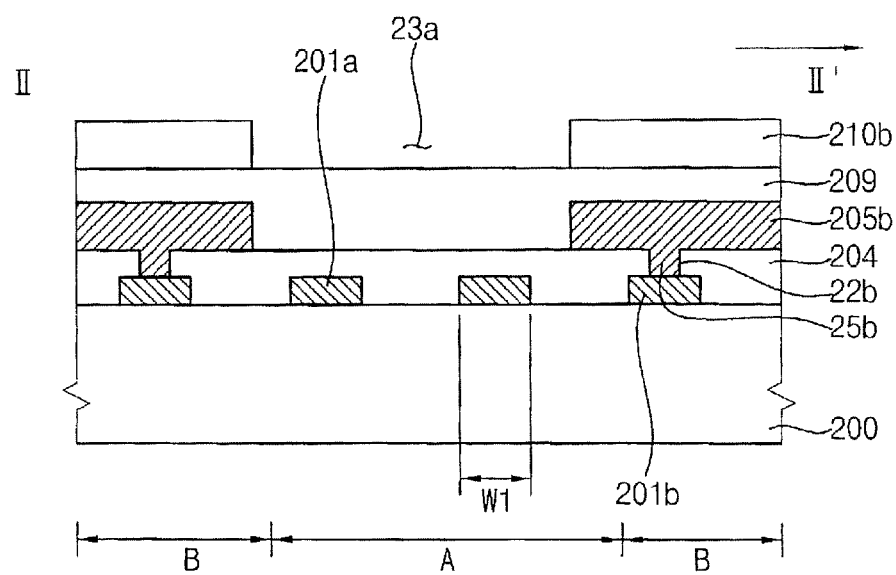
Figure 47:
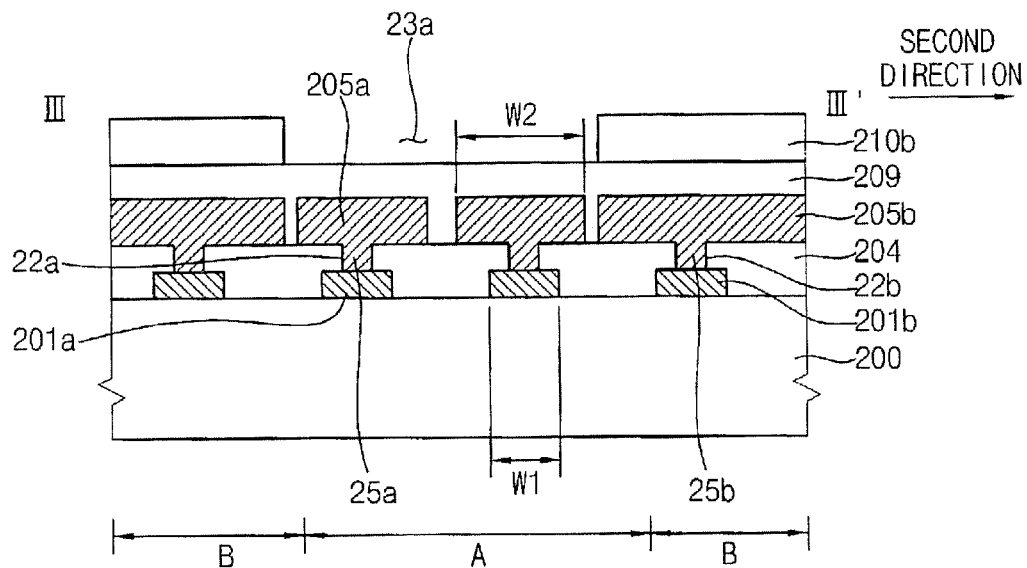

FIG. 28 is a plan view illustrating a fuse structure in accordance with other embodiments of the present invention. FIG. 29 is a cross-sectional view taken along I-I' line in FIG. 28. FIG. 30 is a cross-sectional view taken along II-II' line in FIG. 28. FIG. 31 is a cross-sectional view taken along III-III' line in FIG. 28.

Referring to FIGS. 28 to 31, an insulating structure 200 having a fuse region A and a wire region B is provided on an integrated circuit substrate, such as a semiconductor substrate. The insulating structure 200 may include an oxide such as silicon oxide. Alternatively, the insulating structure 200 may include a nitride such as silicon nitride.

Although not illustrated in FIGS. 28 to 31, a contact electrically connected to a conductive structure that is located in the substrate below the insulating structure 200 may be provided through the insulating structure 200. The conductive structure may be a transistor, a capacitor, a wire pattern, a word line, a bit line, a source region or a drain region.

At least one fuse pattern 201a and at least one first wire pattern 201b are provided on the insulating structure 200. The fuse pattern 201a and the first wire pattern 201b may include a metal such as aluminum. Alternatively the fuse pattern 201a and the first wire pattern 201b may include polysilicon doped with impurities.

The fuse pattern 201a may extend on the fuse region A and the wire region B in the first direction. In addition, the fuse pattern 201a may have a first width W1 in a second direction substantially perpendicular to the first direction. The first wire pattern 201b extends on the wire region B in the first direction.

The fuse pattern 201a may be spaced apart from the first wire pattern 201b in the second direction. In case that the number of fuse patterns 201a is at least two, the fuse patterns 201a may be spaced apart from one another in the second direction. In case that the number of first wire patterns 201b is at least two, the fuse patterns 201a may be spaced apart from one another in the second direction.

A first insulating pattern 204b is provided on the wire region B of the insulating structure 200. The first insulating pattern 204b may cover the fuse pattern 201a and the wire pattern 201b. The first insulating pattern 204b may include an oxide such as silicon oxide. Alternatively, the first insulating pattern 204b may include a nitride such as silicon nitride. The first insulating pattern 204b may have at least one second hole 22b exposing the fuse pattern 201a or the first wire pattern 201b.

At least one lower protecting pattern 204a is provided on the fuse region B. A height of the lower protecting pattern 204a is substantially the same as a height of the first insulating pattern 204b. The lower protecting pattern 204a may include an oxide such as silicon oxide. Alternatively, the lower protecting pattern 204a may include a nitride such as silicon nitride. The lower protecting pattern 204a may have a second opening 22a exposing the fuse pattern 201a.

The lower protecting pattern 204a may extend in the second direction. The lower protecting pattern 204a may have a second width in the second direction substantially greater than the first width W1. The lower protecting pattern 204a may be spaced apart from the first insulating pattern 204b. In case that the number of lower protecting patterns 204a is at least two, the lower protecting patterns 204a may be spaced apart from one another.

As illustrated in FIGS. 28 and 31, the lower protecting pattern 204a may enclose the fuse pattern 201a in the second direction. That is, the lower protecting pattern 204a may be overlapped with the fuse pattern 201a. However, a position of the lower protecting pattern 204a may be varied. For example, the lower protecting pattern 204a may enclose at least two fuse patterns 201a in the second direction or the lower protecting pattern 204a may be overlapped with at least two fuse patterns 201a.

At least one second wire pattern 205b is located on the first insulating pattern 204b. The second wire pattern 205b may have a lower portion 25b filling up the second hole 22b. Thus, the second wire pattern 205b may be electrically connected to the fuse pattern 201a or the first wire pattern 201b.

The second wire pattern 205b may include a metal such as aluminum. Alternatively, the second wire pattern 205b may include polysilicon doped with impurities. In case that the number of second wire patterns 205b is at least two, the second wire patterns 205b may be spaced apart from one another.

An upper protecting pattern 205a is provided on the lower protecting pattern 204a. Thus, a fence 211a including the lower protecting pattern 204a and the upper protecting pattern 205a is provided. The fence 211a may prevent at least some fractures of the fuse pattern 201a from spattering in a direction along which the fuse pattern 201a extends. The fractures of the fuse pattern 201a may be generated when the fuse pattern 201a is cut by a laser.

A height of the upper protecting pattern 205a may be substantially the same as a height of the second wire pattern 205b. The upper protecting pattern 205a may include a metal such as aluminum. Alternatively, the upper protecting pattern 205a may include polysilicon doped with impurities.

The upper protecting pattern 205a has a lower portion 25b filling up the second opening 22a. Thus, the upper protecting pattern 205a may be electrically connected to the fuse pattern 201a. Here, the upper protecting pattern 205a may not easily lean over, because the lower portion 25b of the upper protecting pattern 205a fills up the second opening 22a.

A second insulating pattern 209b covering the second wire pattern 205b is provided on the first insulating pattern 204b. The second insulating pattern 209b may include an oxide such as silicon oxide. Alternatively, the second insulating pattern 209b may include a nitride such as silicon nitride.

As illustrated in FIGS. 28 and 29, two fences 211a located on the fuse pattern 201a may face each other. In this case, the laser used to cut the fuse pattern 201a may be irradiated onto a portion of the fuse pattern 201a exposed between the fences 211a.

FIGS. 32, 36, 40, 44 and 48 are plan views illustrating methods of forming a fuse structures in FIGS. 28 to 31. FIGS. 33, 37, 41, 45 and 49 are cross-sectional views taken along (-(' lines in FIGS. 32, 36, 40, 44 and 48, respectively. FIGS. 34, 38, 42, 46 and 50 are cross-sectional views taken along ((-((' lines in FIGS. 32, 36, 40, 44 and 48, respectively. FIGS. 35, 39, 43, 47 and 51 are cross-sectional views taken along (((-(((' lines in FIGS. 32, 36, 40, 44 and 48, respectively.

Referring to FIGS. 32 to 35, an insulating structure 200, at least one fuse pattern 201a and at least one first wire pattern 201b are formed by processes substantially the same as those illustrated in FIGS. 6 to 8.

The insulating structure 200 has a fuse region A and a wire region B. The insulating structure 200 may include an oxide such as silicon oxide. Alternatively, the insulating structure 200 may include a nitride such as silicon nitride. Although not illustrated in FIGS. 32 to 35, a contact electrically connected to a conductive structure that is located in the substrate below the insulating structure 200 may be formed through the insulating structure 200. The conductive structure may be a transistor, a capacitor, a wire pattern, a word line, a bit line, a source region or a drain region.

The fuse pattern 201a extends on the fuse region A and the wire region B in a first direction. In addition, the fuse pattern 201a has a first width W1 in a second direction substantially perpendicular to the first direction. The first wire pattern 201b extends on the wire region B in the first direction. In case that the number of fuse patterns 201a is at least two, the fuse patterns 201a may be spaced apart from one another in the second direction. In case that the number of first wire patterns 201b is at least two, the first wire patterns 201b may be spaced apart from one another in the second direction.

The fuse pattern 201a and the first wire pattern 201b may include a metal such as aluminum. Alternatively, the fuse pattern 201a and the first wire pattern 201b may include polysilicon doped with impurities.

A first insulating layer 202 is formed on the first insulating structure 200 to cover the fuse pattern 201a and the wire pattern 201b. The first insulating layer 202 may include an oxide such as silicon oxide. Alternatively, the first insulating layer 202 may include a nitride such as silicon nitride.

A first mask pattern 203 is formed on the first insulating layer 202. The first mask pattern 203 and the first insulating layer 202 may include substantially different materials to achieve an etching selectivity. In one example, the first insulating layer 202 and the first mask pattern 203 include silicon oxide and silicon nitride, respectively. In another example, the first insulating layer 202 and the first mask pattern 203 may include silicon nitride and silicon oxide, respectively.

The first mask pattern 203 has at least one first opening 21a and at least one first hole 21b. The first opening 21a is formed over the fuse region A. The first hole 21b is formed over the wire region B.

Referring to FIGS. 36 to 39, a first etching process is performed on the first insulating layer 202. The first mask pattern 203 may be used as an etch mask in the first etching process. The first insulating layer 202 may be transformed into a preliminary first insulating pattern 204 having at least one second opening 22a and at least one second hole 22b during the first etching process.

The second opening 22a may be formed over the fuse region A. Particularly, the second opening 22a may vertically correspond to the first opening 21a so as to communicate with the first opening 21a. The second opening 22a may expose the fuse pattern 201a. The second hole 22b may be formed over the wire region B. Particularly, the second hole 22b may vertically correspond to the first hole 21b to communicate with the first hole 21b.

The first mask pattern 203 is removed from the preliminary first insulating pattern 204. The first mask pattern 203 may be removed by an ashing process or a strip process. These may be used alone or in a combination.

A conductive layer 205 may be formed on the preliminary first insulating pattern 204 to fill up the second opening 22a and the second hole 22b. The conductive layer 205 may include a metal such as aluminum. Alternatively, the conductive layer 205 may include polysilicon doped with impurities.

At least one second mask pattern 206a and at least one third mask pattern 206b are formed on the conductive layer 205. The second mask pattern 206a is formed over the fuse region A. In addition, the second mask pattern 206a is formed over the second opening 22a. The second mask pattern 206a has a second width W2 in the second direction. The second width W1 may be substantially greater than the first width W1. The third mask pattern 206b is formed over the wire region B. In addition, the third mask pattern 206b is formed over the second hole 22b.

The second mask pattern 206a may be spaced apart from the third mask pattern 206b. In case that the number of second mask patterns 206a is at least two, the second mask patterns 206a may be spaced apart from one another. In case that the number of third mask patterns 206b is at least two, the third mask patterns 206b may be spaced apart from one another.

A material included in the second and third mask patterns 206a and 206b may be substantially different from that included in the conductive layer 205 to achieve an etching selectivity. In one example, the second and third mask patterns 206a and 206b may include an oxide such as silicon oxide. In another example, the second and third mask patterns 206a and 206b may include a nitride such as silicon nitride.

Referring to FIGS. 40 to 43, a second etching process is performed on the conductive layer 205 until the preliminary first insulating pattern 204 is exposed. The second mask pattern 206a and the third mask pattern 206b together may be used as an etch mask in the second etching process. The conductive layer 205 may be transformed into at least one upper protecting pattern 205a and at least one second wire pattern 205b during the second etching process.

The upper protecting pattern 205a and the second wire pattern 205b may be formed under the second mask pattern 206a and the third mask pattern 206b, respectively. Particularly, the upper protecting pattern 205a is formed over the fuse region A. In addition, the upper protecting pattern 205a has a lower portion 25a filling up the second opening 22a. The second wire pattern 205b may be electrically connected to the fuse pattern 201a or the first wire pattern 201b. The upper protecting pattern 205a may have a second width W2 in the second direction. The second wire pattern 205b may be formed over the wire region B. In addition, the second wire pattern 205b has a lower portion 25b filling up the second hole 22b. Thus, the upper protecting pattern 205a may be electrically connected to the fuse pattern 201a. Here, the upper protecting pattern 205a may not lean over, because the lower portion 25a of the upper protecting pattern 205a fills up the second opening 22a.

The upper protecting pattern 205a is spaced apart from the second wire pattern 205b. In case that the number of upper protecting patterns 205a is at least two, the upper protecting patterns 205a may be spaced apart from one another. In case that the number of second wire patterns 205b is at least two, the second wire patterns 205b may be spaced apart from one another.

Referring to FIGS. 44 to 47, the second mask pattern 206a and the third mask pattern 206b may be removed from the upper protecting pattern 205a and the second wire pattern 205b, respectively. The second mask pattern 206a and the third mask pattern 206b may be removed by an ashing process or a strip process. These may be used alone or in a combination.

A second insulating layer 209 is formed on the preliminary first insulating pattern 204 to cover the upper protecting pattern 205a and the second wire pattern 205b. The second insulating layer 209 may include an oxide such as silicon oxide. Alternatively, the second insulating layer 209 may include a nitride such as silicon nitride.

A fourth mask pattern 210b is formed on the second insulating layer 209. A material included in the fourth mask pattern 210b may be substantially different from that included in the second insulating layer 209 and the preliminary first insulating pattern 204 to achieve an etching selectivity. In one example, the fourth mask pattern 210b includes an oxide such as silicon oxide. In another example, the fourth mask pattern 210b includes a nitride such as silicon nitride.

The fourth mask pattern 210b has a third hole 23a. The third hole 23a may vertically correspond to the fuse region A. Thus, a portion of the second insulating layer 209 vertically corresponding to the fuse region A may be exposed through the third hole 23a.

Referring to FIGS. 48 to 51, a third etching process is performed on the second insulating layer 209 and the preliminary first insulating pattern 204 until the insulating structure 200 is exposed. A fourth mask pattern 210b is used as an etch mask in the third etching process.

The second insulating layer 209 may be transformed into a second insulating pattern 209b that is located over the wire region B during the third etching process. The second insulating pattern 209b may vertically correspond to the wire region B.

The preliminary first insulating pattern 204 may be transformed into a first insulating pattern 204b and at least one lower protecting pattern 204a during the third etching process. The lower protecting pattern 204a is located under the upper protecting pattern 205a. The lower protecting pattern 204a may enclose the lower portion 25a of the upper protecting pattern 205a. The first insulating pattern 204b is located over the wire region B. The first insulating pattern 204b may enclose the lower portion 25b of the second wire structure 205b. As a result, a fence 211a including the lower protecting pattern 204a and the upper protecting pattern 205a may be formed by the third etching process. The fence 211a may prevent at least some fractures of the fuse pattern 201a from spattering in a direction along which the fuse pattern 201a extends. The fractures of the fuse pattern 201a may be generated when the fuse pattern 201a is cut by a laser.

The fourth mask pattern 210b is removed from the second insulating pattern 209b. The fourth mask pattern 210b may be removed by an ashing process or a strip process. These may be used alone or in a combination.

Figure 48:
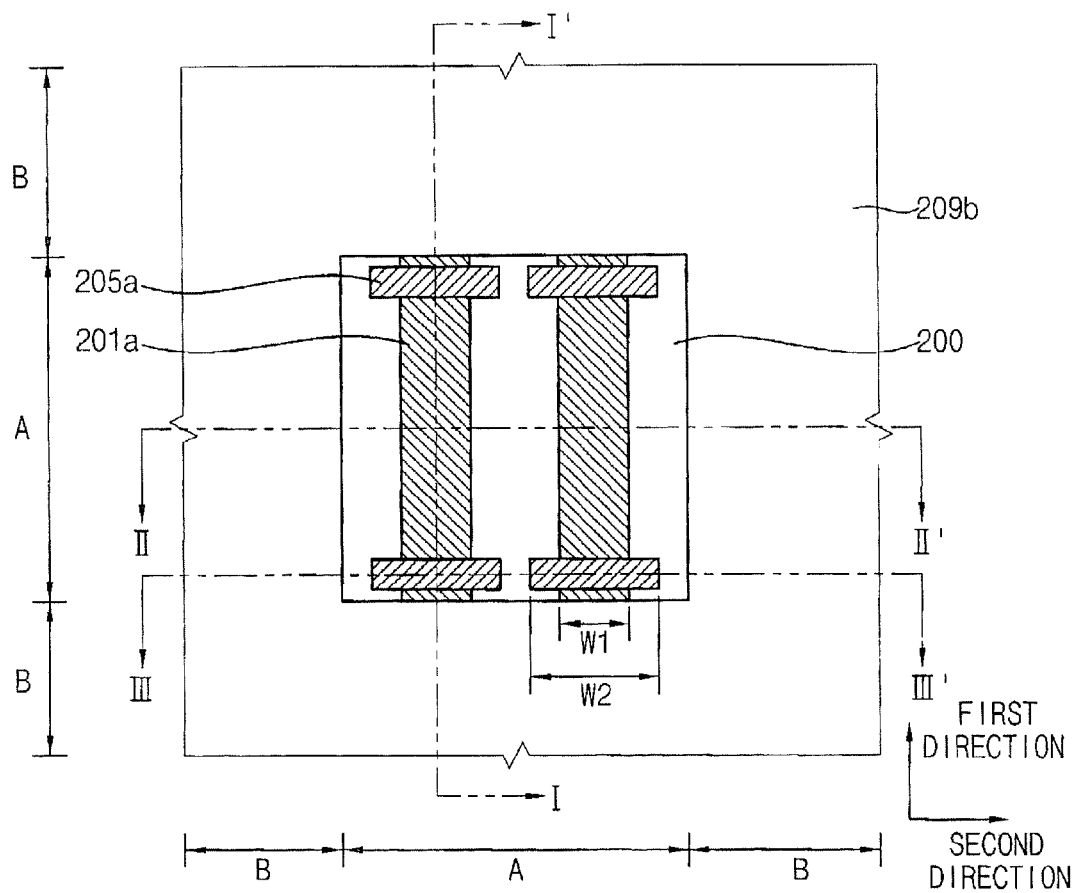

As illustrated in FIGS. 48 and 57, the fence 211a may enclose the fuse pattern 201a in the second direction. That is, the fence 211a may be overlapped with the fuse pattern 201a. As illustrated in FIGS. 36 to 51, a position of the fence 211a may be determined in accordance with a position of the second mask pattern 206a. Thus, in case that the position of the second mask pattern 206a varies, the position of the fence 211a may also vary. For example, the fence 211a may enclose at least two fuse patterns 201a in the second direction. That is, the fence 211a may be overlapped with at least two fuse patterns 201a.

Figure 49:
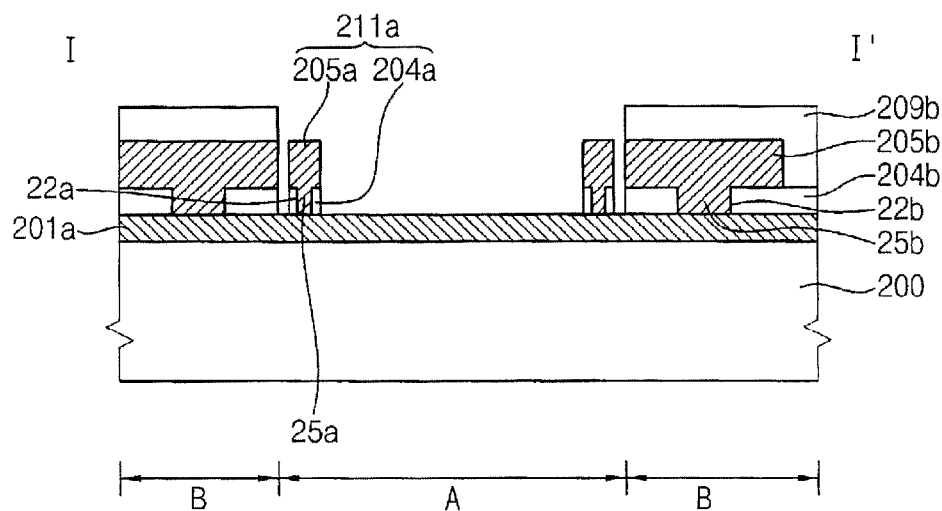
Figure 50:
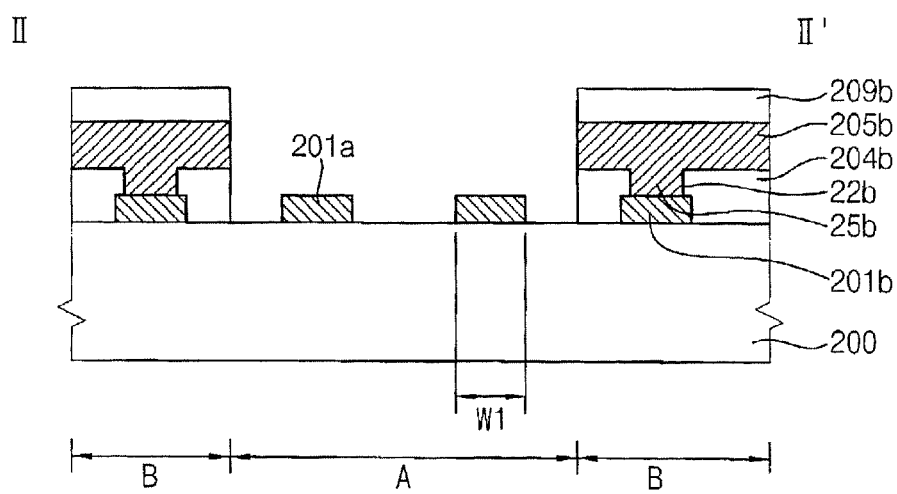
Figure 51:
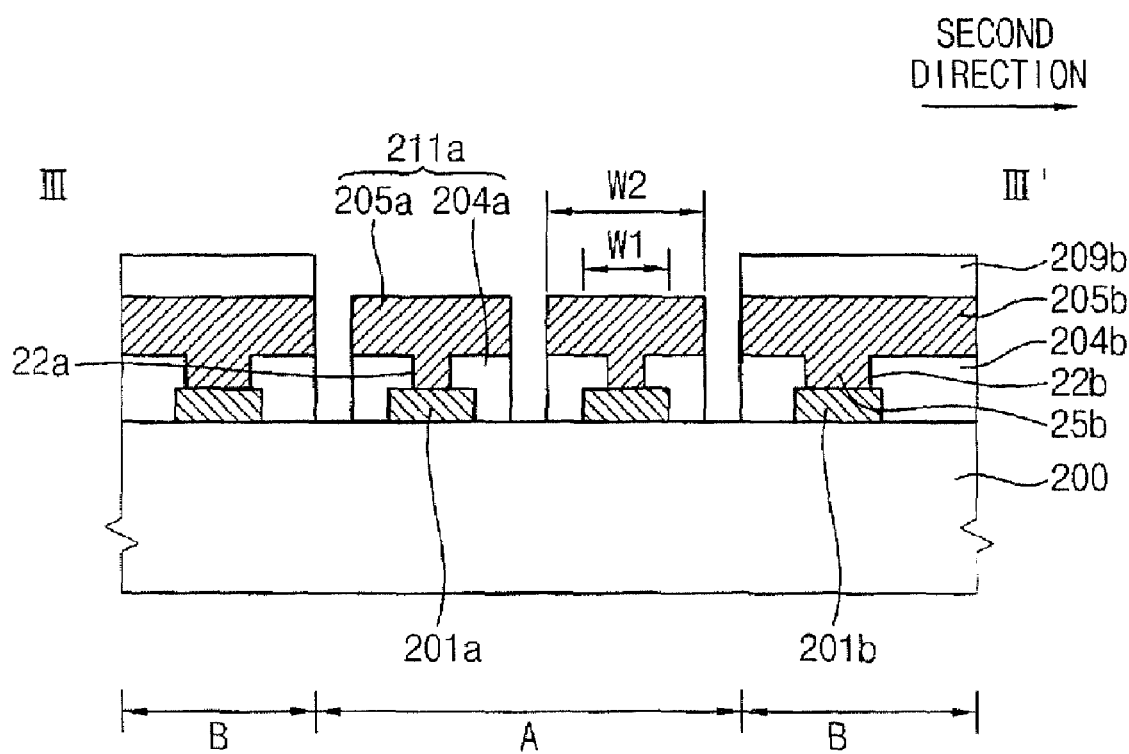

As illustrated in FIGS. 48 and 49, two fences 211a may be formed on the fuse pattern 201a such that two fences 211a face each other. In this case, the laser used to cut the fuse pattern 201a may be irradiated onto a portion of the fuse pattern 201a exposed between the fences 211a.

According to some embodiments of the present invention, a fence including a lower protecting pattern and an upper protecting pattern is provided. The fence may prevent at least some fractures of a fuse pattern from spattering when the fuse pattern is cut by a laser. Thus, the likelihood of an electric short generated between wire patterns adjacent to the fuse pattern may be reduced or prevented.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit fuse structure comprising:
an insulating structure having a fuse region and a wire region adjacent to the fuse region;
at least one fuse pattern extending on both the fuse region and the wire region in a first direction;
an insulating layer pattern on the insulating structure to cover the at least one fuse pattern on the wire region, the insulating layer pattern having an opening portion that exposes the fuse region of the insulating structure; and
at least one fence on the fuse region within the opening portion of the insulating layer pattern to be overlapped with the at least one fuse pattern and extending in a second direction substantially perpendicular to the first direction, the at least one fence being spaced apart from a sidewall of the opening portion of the insulating layer pattern, the fence preventing at least some fractures of the fuse pattern from spattering, wherein the fractures are generated when the fuse pattern is cut.

2. The fuse structure of claim 1, wherein the fence is substantially wider than the fuse pattern in the second direction.

3. The fuse structure of claim 1, wherein the fence encloses at least one fuse pattern in the second direction.

4. The fuse structure of claim 1, wherein at least a portion of the fence extends away from the fuse region as a freestanding structure.

5. The fuse structure of claim 1, wherein two fences are located on the fuse pattern to face each other.

6. The fuse structure of claim 1, wherein the fence comprises:
a lower protecting pattern including an insulating material; and
an upper protecting pattern located on the lower protecting pattern, the upper protecting pattern including a conductive material.

7. The fuse structure of claim 6, wherein the lower protecting pattern insulates the upper protecting pattern from the fuse pattern.

8. The fuse structure of claim 6, wherein the upper protecting pattern includes a lower portion connected to the fuse pattern through the lower protecting pattern.

9. The fuse structure of claim 1, further comprising at least one first wire pattern extending on the wire region in the first direction;
wherein the insulating layer pattern comprises:
a first insulating pattern located on the wire region such that the first insulating pattern covers the fuse pattern and the first wire pattern;
at least one second wire pattern located on the first insulating pattern; and
a second insulating pattern located on the first insulating pattern to cover the second wire pattern.

10. An integrated circuit fuse structure comprising:
an integrated circuit substrate;

an elongated fuse pattern extending along a face of the integrated circuit substrate in a given direction;

an insulating layer pattern on the integrated circuit substrate, the insulating layer pattern having an opening portion that exposes a portion of the elongated fuse pattern; and a spatter shield wall within the opening portion of the insulating layer pattern to be overlapped with the elongated fuse pattern, the spatter shield wall being spaced apart from a sidewall of the opening portion of the insulating layer pattern, the spatter shield wall having a pair of opposing faces that extend away from the face of the integrated circuit substrate and that also extend transverse to the given direction, the pair of opposing faces defining a pair of opposing ends that also extend away from the face of the integrated circuit substrate, and wherein the spatter shield wall faces between the pair of opposing ends are wider than the elongated fuse pattern, the spatter shield wall being located on the integrated circuit substrate relative to the elongated fuse pattern so as to block at least some spatter that is produced along the given direction when the fuse pattern is cut.

11. The fuse structure of claim 10 wherein the elongated fuse pattern includes an intermediate portion between first and second opposing end portions and wherein the spatter shield wall is located on the integrated circuit substrate so as to cross over the first end portion of the elongated fuse pattern.

12. The fuse structure of claim 11 wherein the spatter shield wall is a first spatter shield wall, the integrated circuit fuse structure further comprising a second spatter shield wall having a pair of opposing faces that extend away from the face of the integrated circuit substrate and that also extend transverse to the given direction, the pair of opposing faces defining a pair of opposing ends that also extend away from the face of the integrated circuit substrate, and wherein the second spatter shield wall faces between the pair of opposing ends are wider than the elongated fuse pattern, the second spatter shield wall being located on the integrated circuit substrate so as to cross over the second end portion of the elongated fuse pattern.

13. The fuse structure of claim 10 wherein the spatter shield wall includes a first portion adjacent the integrated circuit substrate and comprising insulating material and a second portion on the first portion, remote from the integrated circuit substrate and comprising conductive material.

14. The fuse structure of claim 13 wherein the second portion is electrically connected to the fuse pattern.

15. The fuse structure of claim 10 wherein the pair of opposing faces extend substantially perpendicular to the given direction.

16. The fuse structure of claim 10 wherein at least a portion of the spatter shield wall extends away from the face of the integrated circuit substrate as a freestanding structure.

17. An integrated circuit fuse structure comprising:

an integrated circuit substrate;

an elongated fuse pattern extending along a face of the integrated circuit substrate in a given direction;

an insulating layer pattern on the integrated circuit substrate, the insulating layer pattern having an opening portion that exposes a portion of the elongated fuse pattern; and a spatter shield within the opening portion of the insulating layer pattern to be overlapped with the elongated fuse pattern, the spatter shield wall being spaced apart from a sidewall of the opening portion of the insulating layer pattern, the spatter shield wall extending away from the face of the integrated circuit substrate, the spatter shield including a first portion adjacent the integrated circuit substrate and comprising insulating material and a second portion on the first portion, remote from the integrated circuit substrate and comprising conductive material, the spatter shield being located on the integrated circuit substrate relative to the elongated fuse pattern so as to block at least some spatter that is produced along the given direction when the fuse pattern is cut.

18. The fuse structure of claim 17 wherein the second portion is electrically connected to the fuse pattern.

19. The fuse structure of claim 17 wherein at least a portion of the spatter shield extends away from the face of the integrated circuit substrate as a freestanding structure.

* * * * *